(12) United States Patent
Kitamoto et al.

(10) Patent No.: US 6,605,963 B2
(45) Date of Patent: Aug. 12, 2003

(54) SEMICONDUCTOR INTEGRATED CIRCUIT AND METHOD OF SWITCHING SOURCE POTENTIAL OF TRANSISTOR IN SEMICONDUCTOR INTEGRATED CIRCUIT

(75) Inventors: Ayako Kitamoto, Kawasaki (JP); Masato Matsumiya, Kawasaki (JP); Satoshi Eto, Kawasaki (JP); Masato Takita, Kawasaki (JP); Toshikazu Nakamura, Kawasaki (JP); Hideki Kanou, Kawasaki (JP); Kuninori Kawabata, Kawasaki (JP); Masatomo Hasegawa, Kawasaki (JP); Toru Koga, Kawasaki (JP); Yuki Ishii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/412,590

(22) Filed: Oct. 5, 1999

(65) Prior Publication Data

US 2002/0145447 A1 Oct. 10, 2002

(30) Foreign Application Priority Data

Nov. 20, 1998 (JP) .......................................... 10-330882

(51) Int. Cl.$^7$ ............................................. H03K 19/185
(52) U.S. Cl. .............................. 326/81; 326/63; 326/68; 326/62; 327/333
(58) Field of Search ............................... 326/62, 65, 81, 326/63; 327/333

(56) References Cited

U.S. PATENT DOCUMENTS

| | | | |
|---|---|---|---|
| 4,486,670 A | | 12/1984 | Chan et al. |
| 4,656,374 A | * | 4/1987 | Rapp ............................. 326/65 |
| 4,845,381 A | * | 7/1989 | Cuevas ........................ 327/333 |
| 5,266,848 A | * | 11/1993 | Nakagome et al. ............. 326/62 |
| 5,321,324 A | * | 6/1994 | Hardee et al. ................ 326/112 |
| 5,559,464 A | * | 9/1996 | Orii et al. ..................... 327/333 |
| 5,666,070 A | * | 9/1997 | Merritt et al. .................. 326/81 |
| 5,698,993 A | * | 12/1997 | Chow ............................ 326/81 |
| 5,852,371 A | * | 12/1998 | Merritt et al. ................. 326/81 |

FOREIGN PATENT DOCUMENTS

| | | | | |
|---|---|---|---|---|
| JP | 5-108194 | | 4/1993 | |
| JP | 04078221 A | * | 2/1994 | ................... 326/81 |
| JP | 40637624 A | * | 2/1994 | ................... 326/81 |
| JP | 6-203558 | | 7/1994 | |
| JP | 7-38417 | | 2/1995 | |

OTHER PUBLICATIONS

Kiyoo Itoh, Super LSI Memory, p. 71, lines 6 through 10, Nov. 5, 1994.

* cited by examiner

Primary Examiner—Michael Tokar
Assistant Examiner—Vibol Tan
(74) Attorney, Agent, or Firm—Armstrong, Westerman & Hattori, LLP

(57) ABSTRACT

A semiconductor integrated circuit, comprising a circuit unit having a predetermined function such as a level shifter circuit or a driver transistor circuit by a combination of a plurality of transistors, is disclosed. Among a plurality of the transistors of the circuit unit, the source potential of at least one transistor adapted to turn off during the standby period of the circuit unit is changed. Preferably, the semiconductor integrated circuit is configured to reduce the sub-threshold current flowing between the source and the drain of at least one transistor adapted to turn off during the standby period of the circuit unit by changing the source potential at a timing based on the standby period of the circuit unit in such a manner that a predetermined bias voltage is applied between the gate and the source of the transistor. A method of switching the source potential of at least one transistor in the semiconductor integrated circuit having the configuration described above is also disclosed.

42 Claims, 16 Drawing Sheets

Fig.1
PRIOR ART
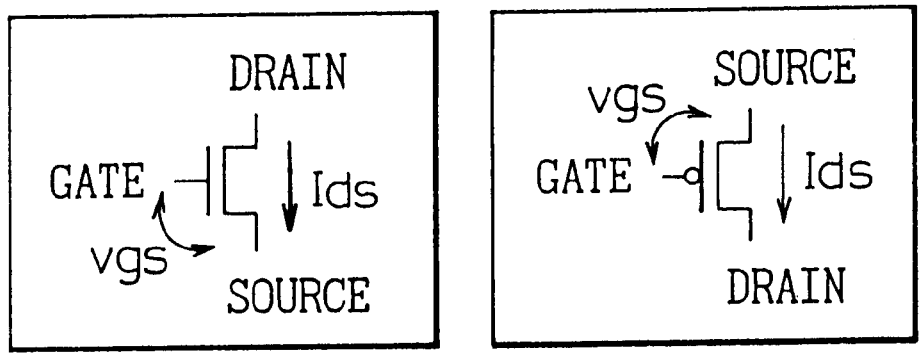
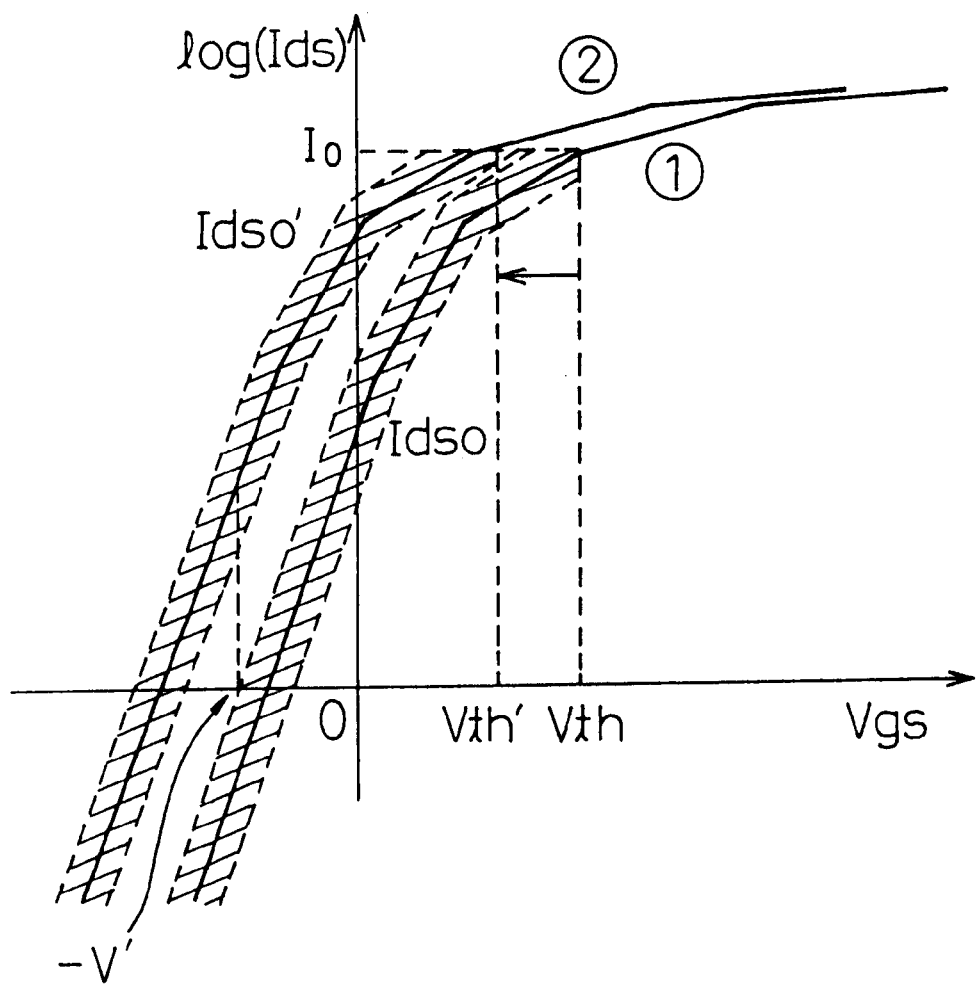

US 6,605,963 B2

SEMICONDUCTOR INTEGRATED CIRCUIT AND METHOD OF SWITCHING SOURCE POTENTIAL OF TRANSISTOR IN SEMICONDUCTOR INTEGRATED CIRCUIT

BACKGROUND OF THE INVENTION

1. Field of the Invention

The present invention relates to a semiconductor integrated circuit, including a circuit unit having a predetermined function such as a level shifter circuit or a driver transistor circuit produced by combining a plurality of transistors, and a source potential switching method for the transistors in the semiconductor integrated circuit.

Especially in the case of a semiconductor integrated circuit configured as a MOS transistor such as an N-channel MOS transistor (hereinafter referred to as an N-ch transistor) or a P-channel MOS transistor (hereinafter referred to as a P-ch transistor), a higher integration and a miniaturization of the semiconductor integrated circuit have been advancing rapidly, and the requirement for a lower voltage of the voltage source and a lower power consumption of the semiconductor integrated circuit tends to increase at present. On the other hand, in order to realize a high operating speed of the semiconductor integrated circuit, a lower threshold voltage between the gate and the source of the MOS transistor is required.

2. Description of the Related Art

Assume that in order to realize the higher integration and miniaturization of the semiconductor integrated circuit as described above, the gate oxide film thickness of the MOS transistor is reduced to 1/k (k: positive number that is equal to 1 or more than 1). In the case in which the durability of the insulation of the gate oxide film remains unchanged, an electric field applied between both terminals of the gate oxide film is required to be constant so as to avoid the dielectric breakdown of the gate oxide film. For this to be achieved, the voltage of the power supply is also required to be reduced to 1/k. In order to realize a high operating speed of the semiconductor integrated circuit, on the other hand, the threshold voltage between the gate and the source of the MOS transistor is also desirably reduced to 1/k. A decreased threshold voltage, however, makes it impossible to cut off the current flowing between the source and the drain, thereby increasing the sub-threshold current during the standby period when the semiconductor integrated circuit is in a standby state.

In order to facilitate understanding of the problems encountered by the increased sub-threshold current during the standby period of a semiconductor integrated circuit such as a conventional level shifter circuit requiring a low-voltage, high-speed operation, the relationship between the voltage between the gate and the source and the sub-threshold current of an ordinary MOS transistor and the configuration and the operation of a conventional level shifter circuit will be explained below with reference to FIGS. 1 to 3 that will be hereinafter described in "BRIEF DESCRIPTION OF THE DRAWINGS".

The graph of FIG. 1 shows the relationship between the voltage between the gate and the source and the current flowing between the source and drain of an ordinary MOS transistor.

In FIG. 1, assuming that Vgs is the voltage between the gate and the source and Ids is the current flowing between the source and the drain of the N-channel transistor in the MOS transistor (abbreviated to N-ch transistor in FIG. 1), the relationship between the voltage between the gate and the source Vgs and the logarithmic value (log(Ids)) of the current Ids is illustrated. Assuming that the voltage Vgs for $\log(Ids)=I_0$ is the threshold voltage between the gate and the source, for example, the threshold voltage of the first N-ch transistor ① is given as Vth and the threshold voltage of the second N-ch transistor ② is Vth'. Generally, the current Ids in a region in which the voltage Vgs is lower than the threshold voltage, i.e., the current Ids with the N-ch transistor in an off state (deactivated state) is called the sub-threshold current.

On the other hand, assume that the current for the voltage Vgs=0 V in the first N-ch transistor ① is Idso and the current for the voltage Vgs=0 V in the second N-ch transistor ② is Idso'. As shown in FIG. 1, suppose that the threshold voltage of the second N-ch transistor ② is lower than the threshold voltage of the first N-ch transistor ①, the currents (Idso and Idso') for the voltage Vgs of 0 V are larger for the second N-ch transistor ② than for the first N-ch transistor ①. The ordinate of the graph of FIG. 1 is in a logarithmic scale (log scale). Thus, the current for the voltage Vgs of 0 V increases by several orders of magnitude. In the case in which a negative bias voltage (−V', for example) is applied as the voltage Vgs, however, the sub-threshold current remarkably decreases. Even though the absolute value of the negative bias voltage −V' may be small, the effect of the negative bias voltage is large since the ordinate of this graph is in a logarithmic scale.

The graph of FIG. 1 shows the relationship between the voltage Vgs and the current Ids flowing between the source and the drain of a N-ch transistor. The same can be said of a P-channel transistor (abbreviated to P-ch transistor in FIG. 1) except that the polarities of the voltage Vgs and the current Ids in the P-ch transistor are opposite to those in the N-ch transistor.

Generally, as the threshold voltage between the gate and the source of the MOS transistor is reduced, the sub-threshold current tends to increase. The sub-threshold current increases in proportion to the ratio (W/L) of the gate width to the gate length of the MOS transistor. Further, as a larger storage capacity, a higher integration and a miniaturization of a semiconductor integrated circuit have been advanced, the total gate widths W of a plurality of MOS transistors formed in the whole semiconductor chip constituting the semiconductor integrated circuit tend to increase. Because of the above-mentioned tendencies, the magnitude of the sub-threshold current has become not negligible.

In order to reduce the sub-threshold current during the standby period, the following protective method has been employed in the prior art. For a word decoder with the large total gate widths of the transistors, as disclosed in Japanese Unexamined Patent Publication (Kokai) No. 6-203558, a method has been employed for reducing the gate width (W) of the transistor connected to a power supply by inserting a transistor having the small gate width between the power supply and a circuit.

Further, as disclosed in Japanese Unexamined Patent Publication (Kokai) No. 5-108194, a method has been employed for reducing the current during the standby period by differentiating the bias of the well or the substrate between the activated period when the semiconductor integrated circuit is activated and the standby period during which the semiconductor integrated period is in a standby state.

Furthermore, as disclosed in Japanese Unexamined Patent Publication (Kokai) No. 7-38417, a method has been employed in which a resistor or a switching element is inserted between the MOS transistor constituting an inverter and a power supply thereby to impose a negative bias on the MOS transistor, or in which transistors of different threshold values and power supplies of different potentials are used during the activated period and the standby period.

Now, with regard to a level shifter circuit in which the input signal potential is required to be changed at high speed with a low voltage power supply, an explanation will be given of the relationship between the threshold voltage between the gate and source of the MOS transistor and the sub-threshold current.

FIG. 2 is a circuit diagram showing a configuration of a first example of a conventional level shifter circuit. The level shifter circuit shown in FIG. 2 is disclosed in U.S. Pat. No. 4,486,670.

In the level shifter circuit 100 shown in FIG. 2, in order to produce an output signal OUT by converting the potential of an input signal IN from the potential V1 of a first positive power supply to the potential V2 (V1<V2) of a second positive power supply, the gates and the drains of a P-ch transistor 101 and a P-ch transistor 102 are interconnected by cross coupling. Further, the level shifter circuit of FIG. 2 includes a first inverter for inverting the polarity of the input signal IN and a second inverter for inverting the signal output from the first inverter and supplying it to the gate of the P-ch transistor 101. The output signal OUT is produced from the drain of the P-ch transistor 102. The first inverter includes a P-ch transistor 107 and a N-ch transistor 108 connected between the first power supply and the third power supply (ground potential V0). On the other hand, the second inverter includes a P-ch transistor 105 and a N-ch transistor 106 interposed between the first power supply and the third power supply.

Further, in the level shifter circuit of FIG. 2, the N-ch transistors 103, 104 with the gate thereof connected to the first power supply are N-ch transistors which are inserted for protecting a transistor having a relatively low durability against the applied voltage such as the N-ch transistor 108 or the N-ch transistor 106, and are not necessary when a voltage level in the power supply is reduced.

For guaranteeing high-speed and stable operation of the level shifter circuit when the voltage level in the power supply is reduced, however, it is necessary to reduce the threshold voltage as much as possible between the gate and the source of the N-ch transistor 108 and the N-ch transistor 106 in the level shifter circuit. Alternatively, it is necessary to considerably increase the gate width of each of the N-ch transistors 106, 108 as compared with the gate width of each of the P-ch transistor 107 and the P-ch transistor 105.

In the case in which the input signal is at a low voltage level ("L" (low) level) during the standby period of the level shifter circuit, the N-ch transistor 108 having a relatively large gate width enters an off state (deactivated state), so that the sub-threshold current with the N-ch transistor 108 in an off state increases relatively. In the case in which the input signal is at high voltage level ("H" (high) level) during the standby period of the level shifter circuit, on the other hand, the N-ch transistor 106 with the gate width relatively large is in an off state, in which case the sub-threshold current is relatively large.

FIG. 3 is a circuit diagram showing a configuration of a second example of a conventional level shifter circuit. The level shifter circuit of FIG. 3 is a circuit disclosed in the reference "Very Large Scale Integrated Memory" (authored by Kiyoo Ito, published by Baifuhkan on Feb. 5, 1994 (First Edition), pp. 71, lines 7 to 10).

In the level shifter circuit 120 shown in FIG. 3, in order to produce an output signal OUT by converting the potential of the input signal IN from the potential V1 of a first positive power supply to the potential V2 (V1<V2) of a second positive power supply, the gates and the drains of the P-ch transistor 121 and the P-ch transistor 122 are interconnected by cross coupling.

Further, in the level shifter circuit of FIG. 3, the drain of the N-ch transistor 123 is connected to the gate of the P-ch transistor 122, and the source of the N-ch transistor 123 is connected to the third power supply of the ground potential V0. On the other hand, the drain of the N-ch transistor 124 is connected to the gate of the P-ch transistor 121, and the source of the N-ch transistor 124 is connected to the third power supply of the ground potential V0. The input signal IN is input to the gate of the N-ch transistor 123 and also, input to the gate of the N-ch transistor 124 through an inverter including the P-ch transistor 125 and the N-ch transistor 126. Also, the output signal OUT is output from the drain of the P-ch transistor 122.

Further, in the level shifter circuit of FIG. 3, in order to guarantee high-speed, stable operation of the level shifter circuit when the power supply is reduced in voltage, as the potential difference which is to be converted by the level shifter circuit (e.g., a difference value brought about between the potential difference V1-V0 and the potential difference V2-V0) becomes large, the threshold voltage between the gate and the source of each of the N-ch transistor 123 and the N-ch transistor 124 in the level shifter circuit is required to be reduced as much as possible. Alternatively, as described above, the gate width of each of the N-ch transistors 123, 124 is required to be considerably large as compared with the gate width of each of the P-ch transistor 121 and the P-ch transistor 122.

In the case in which the input signal is at "L" level during the standby period of the level shifter circuit, the N-ch transistor 123 having the relatively large gate width turns off and, as in the case of FIG. 2, the sub-threshold current in an off state becomes relatively large. In the case in which the input signal is at "H" level during the standby period of the level shifter circuit, on the other hand, the N-ch transistor 124 having a relatively large gate width, turns off so that, as in the case of FIG. 2, the sub-threshold current in an off state becomes relatively large.

As described above, in the semiconductor integrated circuit such as the level shifter circuit (or the driver transistor circuit described later) requiring a low-voltage, high-speed operation, the voltage reduction of the power supply and the decrease of the threshold voltage between the gate and source of the MOS transistor tend to proceed in cooperation with each other. Specifically, with the advance of a higher integration, a miniaturization and a voltage reduction of the semiconductor integrated circuit, the threshold voltage between the gate and source of the MOS transistor decreases, thereby causing the problem of an increased sub-threshold current during the standby period. In the conventional level shifter circuit, however, no effective measures have been employed for reducing the sub-threshold current during the standby period. Thus the increase in power consumption due to the extraneous current such as the sub-threshold current must be minimized.

SUMMARY OF THE INVENTION

The present invention has been developed in view of the problems described above, and the object of the present invention is to provide a semiconductor integrated circuit, such as a level shifter circuit or a driver transistor circuit requiring a low-voltage, high-speed operation, in which power consumption is reduced by reducing the sub-threshold current as much as possible during the standby period.

In order to achieve the object described above, according to the present invention, there is provided a semiconductor integrated circuit comprising a circuit unit including a plurality of transistors having a predetermined function, wherein the source potential of at least one of the transistors which turns off during the standby period of the circuit unit is changed.

Preferably, in a semiconductor integrated circuit according to the present invention, the source potential of at least one transistor (object transistor) adapted to turn off during the standby period of the circuit unit is changed in such a manner that a predetermined bias voltage is applied between the gate and source of the particular transistor at a timing based on the standby period of the circuit unit.

Preferably, a semiconductor integrated circuit according to the present invention is configured so as to reduce the sub-threshold current flowing between the source and drain of at least one transistor which turns off during the standby period of the circuit unit.

According to a first aspect of the present invention, there is provided a semiconductor integrated circuit wherein the circuit unit is a level shifter circuit including a plurality of transistors for changing the potential of the input signal upward or downward.

Preferably, in the semiconductor integrated circuit according to the first aspect of the present invention, the timing of changing the source potential of the transistor which turns off during the standby period of the level shifter circuit is set in accordance with the potential change of the input signal or in accordance with a predetermined program instruction.

Preferably, in the semiconductor integrated circuit according to the first aspect of the present invention, a switching element for changing the source potential of one or a plurality of transistors which turn off during the standby period of the level shifter circuit is assigned to the particular transistor. This switching element changes the source potential of the transistor in such a manner that a predetermined bias voltage is applied between the gate and the source of the same transistor (object transistor) during the standby period of the level shifter circuit.

Preferably, in the semiconductor integrated circuit according to the first aspect of the present invention, the level shifter circuit includes at least a transistor of a first conduction type (such as an N-ch transistor) for changing the potential of the input signal and at least a transistor of a second conduction type (such as a P-ch transistor). A switching element for changing the source potential of one or a plurality of transistors of a first conduction type which turn off during the standby period of the level shifter circuit is assigned to the particular transistor of a first conduction type. This switching element includes a transistor of a second conduction type having a drain connected to the source of the transistor of a first conduction type, and the source of the transistor of a second conduction type is connected to a power supply for applying a predetermined bias voltage between the gate and source of the transistor of a first conduction type thereby to supply a signal to the gate of the transistor of a second conduction type for turning on the transistor of a second conduction type during the standby period of the level shifter circuit. Thus, during the standby period of the level shifter circuit, the source potential of the transistor of a first conduction type is kept at a potential substantially equal to the power supply (e.g., a potential lower (or higher) than the potential of the power supply, by a voltage level corresponding to the threshold voltage between the gate and the source of the transistor).

Preferably, in the semiconductor integrated circuit according to the first embodiment of the present invention, the level shifter circuit includes at least a transistor of a first conduction type and at least a transistor of a second conduction type for changing the potential of the input signal, and in the case in which the sub-threshold current during an off state of the transistor of a first conduction type is larger than the sub-threshold current during an off state of the transistor of a second conduction type, the source potential of the transistor of a first conduction type which turns off during the standby period of the level shifter circuit is changed at a timing based on the standby period.

Preferably, in the semiconductor integrated circuit according to a modified example of the first embodiment of the present invention, the level shifter circuit includes at least a transistor of a first conduction type and at least a transistor of a second conduction type for changing the potential of the input signal, and a switching element for changing the source potential of one or a plurality of transistors of a second conduction type adapted to turn off during the standby period of the level shifter circuit is assigned to the particular transistor of a second conduction type. This switching element includes a transistor of a first conduction type having a drain connected to the source of the transistor of a second conduction type, and the source of the transistor of a first conduction type is connected to a power supply for applying a predetermined bias voltage between the gate and source of the transistor of a first conduction type. The gate of the transistor of a first conduction type is supplied with a signal for turning on the transistor of a first conduction type during the standby period of the level shifter circuit, so that the source potential of the transistor of a second conduction type is kept at a potential substantially equal to the potential of the power supply during the standby period of the level shifter circuit.

Preferably, in a semiconductor integrated circuit according to a modified example of the first aspect of the present invention, the level shifter circuit includes at least a transistor of a first conduction type and at least a transistor of a second conduction type for changing the potential of the input signal, wherein, in the case in which the sub-threshold current with the transistor of a second conduction type in an off state is larger than the sub-threshold current with the transistor of a first conduction type in an off state, the source potential of the transistor of a second conduction type which turns off during the standby period of the level shifter circuit is changed at a timing based on the standby period.

According to a second aspect of the present invention, there is provided a semiconductor integrated circuit comprising a level shifter circuit in which the gates and the drains of a first P-ch transistor and a second P-ch transistor for converting the potential of the input signal from the potential of the first power supply to the potential of the second power supply are interconnected by cross coupling, and the gate of a selected one of the first and second P-ch transistors is connected to the drain of the first N-ch transistor. The source of the first N-ch transistor of the level shifter circuit is connected to a first power supply through the drain of a third P-ch transistor on the one hand and to a third power supply lower in potential than the first and second power supplies through the drain of the second N-ch transistor on the other hand.

Preferably, in the semiconductor integrated circuit according to the second aspect of the present invention, the input signal is input to the gate of the first N-ch transistor and also, input to the gates of the third P-ch transistor and the second N-ch transistor at the same time. During the standby period of the level shifter circuit, the potential of the input signal becomes equal to the potential of the third power supply so that the first N-ch transistor turns off. At the same time, the third P-ch transistor turns on while the second N-ch transistor turns off, so that the source potential of the first N-ch transistor is kept substantially at the potential of the first power supply during the standby period of the level shifter circuit.

Preferably, in the semiconductor integrated circuit according to the second aspect of the present invention, the timing of changing the source potential of the first N-ch transistor which turns off during the standby period of the level shifter circuit is set in accordance with the potential change of the input signal of the level shifter or in accordance with a predetermined program instruction.

Preferably, in the semiconductor integrated circuit according to the second aspect of the present invention, a switching element configured of the third P-ch transistor and the second N-ch transistor is assigned to one or a plurality of the first N-ch transistors which turn off during the standby period of the level shifter circuit, and a signal for turning on the third P-ch transistor during the standby period of the level shifter circuit is supplied to the gate of the third P-ch transistor in the switching element. Thus, during the standby period of the level shifter circuit, the source potential of one or a plurality of the first N-ch transistors is kept substantially at the potential of the first power supply, so that the source potential of the first N-ch transistor is changed in such a manner that a negative bias voltage is applied between the gate and source of one or a plurality of the first N-ch transistors.

Preferably, in the semiconductor integrated circuit according to the second aspect of the present invention, in the case in which the sub-threshold current with the first N-ch transistor in an off state is larger than the sub-threshold current with the first P-ch transistor and the second P-ch transistor in an off state in the level shifter circuit, the gate of the third P-ch transistor is supplied with a signal for turning on the third P-ch transistor during the standby period of the level shifter circuit, and the source potential of the first N-ch transistor is kept substantially at the potential of the first power supply during the standby period of the level shifter circuit, so that the source potential of the first N-ch transistor is changed in such a manner as to apply a negative bias voltage between the gate and source of the first N-ch transistor.

According to a third aspect of the present invention, there is provided a semiconductor integrated circuit comprising a level shifter circuit in which the gates and drains of the first N-ch transistor and the second N-ch transistor for converting the potential of the input signal from the potential of a fourth power supply to the potential of a fifth power supply are interconnected by cross coupling and the gate of one of the first and second N-ch transistors is connected to the drain of the first P-ch transistor. The source of the first P-ch transistor of the level shifter is connected to the fourth power supply through the drain of the third N-ch transistor on the one hand and to the sixth power supply higher in potential than the fourth and fifth power supplies through the drain of the second P-ch transistor on the other hand.

Preferably, in the semiconductor integrated circuit according to the third aspect of the present invention, the input signal is input to the gate of the first P-ch transistor and also, input to the gate of each of the third N-ch transistor and the second P-ch transistor. During the standby period of the level shifter circuit, the potential of the input signal increases to such a high level as to turn off the first P-ch transistor, while at the same time turning on the third N-ch transistor, so that the second P-ch transistor turns off, and the source potential of the first P-ch transistor is kept at the potential of the fourth power supply during the standby period of the level shifter circuit.

Preferably, in the semiconductor integrated circuit according to the third aspect of the present invention, the timing of changing the source potential of the first P-ch transistor which turns off during the standby period of the level shifter circuit is set in accordance with the potential change of the input signal of the level shifter circuit or in accordance with a predetermined program instruction.

Preferably, in the semiconductor integrated circuit according to the third aspect of the present invention, a switching element configured of the third N-ch transistor and the second P-ch transistor is assigned to one or a plurality of the first P-ch transistors which turn off during the standby period of the level shifter circuit, and the gate of the third N-ch transistor in the switching element is supplied with a signal for turning on the third N-ch transistor during the standby period of the level shifter circuit. During the standby period of the level shifter circuit, the source potential of one or a plurality of the first P-ch transistors is kept substantially at the potential of the fourth power supply, and the source potential of the first P-ch transistor is changed in such a manner that a positive bias voltage is applied between the gate and the source of one or a plurality of the first P-ch transistors.

Preferably, in the semiconductor integrated circuit according to the third aspect of the present invention, in the case in which the sub-threshold current with the first P-ch transistor in an off state is larger than the sub-threshold current with each of the first N-ch transistor and the second N-ch transistor in an off state, the gate of the third N-ch transistor is supplied with a signal for turning on the third N-ch transistor during the standby period of the level shifter circuit. During the standby period of the level shifter circuit, the source potential of the first P-ch transistor is kept substantially at the potential of the fourth power supply, so that the source potential of the first P-ch transistor is changed in such a manner that a positive bias voltage is applied between the gate and the source of the first P-ch transistor.

According to a fourth aspect of the present invention, there is provided a semiconductor integrated circuit comprising a source potential switching circuit for changing the source potential of at least one of a plurality of the transistors which turns off during the standby period of the circuit unit.

Preferably, in the semiconductor integrated circuit according to the fourth aspect of the present invention, the source potential switching circuit changes the source potential of at least one transistor which turns off during the standby period of the circuit unit in such a manner that a predetermined bias voltage is applied between the gate and source of the particular transistor at a timing based on the standby period of the circuit unit.

Preferably, the semiconductor integrated circuit according to the fourth aspect of the present invention is so configured as to reduce the sub-threshold current flowing between the source and drain of at least one transistor which turns off during the standby period of the circuit unit.

Preferably, in the semiconductor integrated circuit according to the fourth aspect of the invention, the circuit unit is a level shifter circuit including a plurality of transistors for changing the potential of the input signal upward or downward.

Preferably, in the semiconductor integrated circuit according to the fourth aspect of the invention, the present timing of changing the source potential of the transistor adapted to turn off during the standby period of the level shifter circuit is set in accordance with the potential change of the input signal of the level shifter circuit or in accordance with a predetermined program instruction.

Preferably, in the semiconductor integrated circuit according to the fourth aspect of the present invention, the level shifter circuit includes at least a transistor of a first conduction type and at least a transistor of a second conduction type for changing the potential of the input signal, and in the case in which the sub-threshold current with the transistor of a second conduction type in off state is larger than the sub-threshold current with the transistor of a first conduction type in an off state, the source potential of the transistor of a second conduction type adapted to turn off during the standby period of the level shifter circuit is changed at a timing based on the standby period.

According to a fifth aspect of the present invention, there is provided a semiconductor integrated circuit wherein the circuit unit is at least one of a main driver transistor circuit having a plurality of transistors for driving the internal wiring unit of the semiconductor integrated circuit and a preceding-stage driver transistor circuit located in the stage before the main driver transistor circuit.

Preferably, in the semiconductor integrated circuit according to the fifth aspect of the present invention, the timing of changing the source potential of the transistor adapted to turn off during the standby period of the driver transistor circuit is set in accordance with the potential change of the input signal of the driver transistor circuit or in accordance with a predetermined program instruction.

Preferably, in the semiconductor integrated circuit according to the fifth aspect of the present invention, the source potential switching circuit for changing the source potential of one or a plurality of transistors adapted to turn off during the standby period of the driver transistor circuit is assigned to the particular transistor, and the source potential switching circuit changes the source potential of the object transistor in such a manner that a predetermined bias voltage is applied between the gate and source of the object transistor during the standby period of the driver transistor circuit.

Preferably, in the semiconductor integrated circuit according to the fifth aspect of the present invention, the driver transistor circuit includes at least a transistor of a first conduction type and at least a transistor of a second conduction type, the source potential switching circuit for changing the source potential of the transistor of a first conduction type is assigned to one of a plurality of transistors of a first conduction type adapted to turn off during the standby period of the driver transistor circuit, the source potential switching circuit includes a transistor of a second conduction type having a drain connected to the source of the transistor of a first conduction type, the source of the transistor of a second conduction type is connected to a power supply for applying a predetermined bias voltage between the gate and source of the transistor of a first conduction type, a signal for turning on the transistor of a second conduction type during the standby period of the driver transistor circuit is applied to the gate of the transistor of a second conduction type, and the source potential of the transistor of a first conduction type is kept substantially at the potential of the power supply during the standby period of the driver transistor circuit.

Preferably, in the semiconductor integrated circuit according to the fifth aspect of the present invention, the driver transistor circuit includes at least a transistor of a first conduction type and at least a transistor of a second conduction type, the source potential switching circuit for changing the source potential of the transistor of a first conduction type is assigned to one or a plurality of transistors of a first conduction type adapted to turn off during the standby period of the driver transistor circuit, the source potential switching circuit includes a second transistor of a first conduction type having a source connected to the source of the transistor of a first conduction type, the drain of the second transistor of a first conduction type is connected to a power supply for applying a predetermined bias voltage between the gate and source of the transistor of a first conduction type, a signal for turning on the second transistor of a first conduction type during the standby period of the driver transistor circuit is applied to the gate of the first transistor of a first conduction type, and the source potential of the transistor of a first conduction type is kept substantially at the potential of the power supply during the standby period of the driver transistor circuit.

Preferably, in the semiconductor integrated circuit according to the fifth aspect of the present invention, the driver transistor circuit includes at least a transistor of a first conduction type and at least a transistor of a second conduction type, and in the case in which the sub-threshold current with the transistor of a first conduction type in an off state is larger than the sub-threshold current with the transistor of a second conduction type in an off state, the source potential of the transistor of a first conduction type adapted to turn off during the standby period of the driver transistor circuit is changed at a timing based on the standby period.

Preferably, in the semiconductor integrated circuit according to the fifth aspect of the present invention, the driver transistor circuit includes at least a transistor of a first conduction type and at least a transistor of a second conduction type, the source potential switching circuit for changing the source potential of the transistor of a second conduction type is assigned to one or a plurality of transistors of a second conduction type adapted to turn off during the standby period of the driver transistor circuit, the source potential switching circuit includes a transistor of a first conduction type having a drain connected to the source of the transistor of a second conduction type, the source of the transistor of a first conduction type is connected to a power supply for applying a predetermined bias voltage between the gate and source of the transistor of a second conduction type, a signal for turning on the transistor of a first conduction type during the standby period of the driver transistor circuit is applied to the gate of the transistor of a first conduction type, and the source potential of the transistor of a second conduction type is kept substantially at the potential of the power supply during the standby period of the driver transistor circuit.

Preferably, in the semiconductor integrated circuit according to the fifth aspect of the present invention, the driver transistor circuit includes at least a transistor of a first conduction type and at least a transistor of a second conduction type, the source potential switching circuit for changing the source potential of the transistor of a second conduction type is assigned to one or a plurality of transistors of a second conduction type adapted to turn off during the standby period of the driver transistor circuit, the source potential switching circuit includes a second transistor of a second conduction type having a source connected to the source of the first transistor of a second conduction type, the drain of the second transistor of a second conduction type is connected to a power supply for applying a predetermined bias voltage between the gate and source of the first transistor of a second conduction type, a signal for turning on the second transistor of a second conduction type during the standby period of the driver transistor circuit is applied to the gate of the second transistor of a second conduction type, and the source potential of the first transistor of a second conduction type is kept substantially at the potential of the power supply during the standby period of the driver transistor circuit.

Preferably, in the semiconductor integrated circuit according to the fifth aspect of the present invention, the driver transistor circuit includes at least a transistor of a first conduction type and at least a transistor of a second conduction type, and in the case in which the sub-threshold current with the transistor of a second conduction type in an off state is larger than the sub-threshold current with the transistor of a first conduction type in an off state, the source potential of the transistor of a second conduction type adapted to turn off during the standby period of the driver transistor circuit is changed at a timing based on the standby period.

According to still another aspect of the present invention, there is provided a source potential switching method for a transistor in a semiconductor integrated circuit wherein, in the case in which a circuit unit having a predetermined function by a combination of a plurality of transistors is formed in the semiconductor integrated circuit, the source potential of at least one transistor adapted to turn off during the standby period of the circuit unit is changed in such a manner that a predetermined bias voltage is applied between the gate and source of the particular transistor at a timing based on the standby period of the circuit unit, and the potential difference between the gate and source of the particular transistor reduces the sub-threshold current flowing between the source and drain of the transistor.

The semiconductor integrated circuit according to the present invention is intended for a transistor adapted to turn off during the standby period among those transistors having a comparatively large gate width used in a level shifter circuit or a driver transistor circuit required to operate at low voltage and high speed, wherein the source potential of the transistor is changed during the standby period in such a direction as to reduce the sub-threshold current flowing between the source and drain of the same transistor.

More specifically, in the case in which the transistor adapted to turn off during the standby period is a N-ch transistor, the source potential of the same transistor is changed in such a manner that a negative bias voltage is applied between the gate and source of the N-ch transistor during the standby period thereby to reduce the sub-threshold current considerably during the standby period. In the case in which the transistor adapted to turn off during the standby period is a P-ch transistor, on the other hand, the source potential of the same transistor is changed in such a manner that a positive bias voltage is applied between the gate and source of the P-ch transistor during the standby period thereby to reduce the sub-threshold current considerably during the standby period.

Further, in the case in which the sub-threshold current during an off state of the transistor adapted to turn off during the standby period is smaller than the sub-threshold current of the transistor adapted to turn on during the standby period in the main driver transistor circuit in the driver transistor circuit, the transistor of the driver transistor circuit in the preceding stage is included in the present invention. The reason is that the transistor of the main driver transistor circuit for driving the wiring unit often has the large gate width, and normally, the transistor of the main driver transistor circuit is driven by an inverter train (i.e. the preceding-stage driver transistor circuit) with a gate width increased in a predetermined proportion. As a result, the gate width of the transistor in a stage preceding to a transistor having a large gate width is also comparatively increased. As described before, a transistor having a large sub-threshold current in an off state is liable to have a larger sub-threshold current, and therefore produces a larger effect of reducing the sub-threshold current by the above-mentioned technique of changing the source potential. By specifying the transistor for changing the source potential during the standby period, on the other hand, a still larger effect is obtained with a minimum burden on the source potential switching circuit.

In summary, according to the present invention, the sub-threshold current can be remarkably reduced by changing the source potential of the transistor adapted to turn off during the standby period in a level shifter circuit or a driver transistor circuit requiring low-voltage and high-speed operation. Therefore, it is possible to reduce power consumption during the standby period of a semiconductor integrated circuit in which a higher integration, a miniaturization and a reduced voltage are always promoted.

BRIEF DESCRIPTION OF THE DRAWINGS

The above object and features of the present invention will be more apparent from the following description of the preferred embodiments with reference to the accompanying drawings, wherein:

FIG. 1 is a graph showing the relationship between the voltage between the gate and the source and the current flowing between the source of the drain of an ordinary MOS transistor;

DESCRIPTION OF THE PREFERRED EMBODIMENTS

Some preferred embodiments of the present invention will be explained below with reference to the accompanying drawings (FIGS. 4 to 27).

Figure 4:
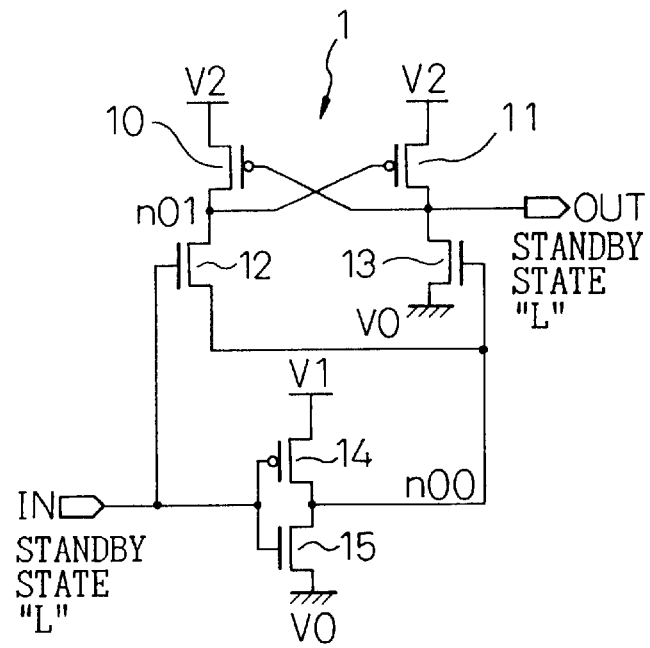
FIG. 4 is a circuit diagram showing a configuration according to a first preferred embodiment of the present invention.

FIG. 4 is a circuit diagram showing a configuration according to first preferred embodiment of the present invention. This diagram illustrates a configuration of a semiconductor integrated circuit comprising a level shifter circuit having a transistor adapted to turn off during the standby period according to the present invention. In the description that follows, the component elements similar to those described above will be designated by the same reference numerals, respectively.

In FIG. 4, a circuit example is shown in which, during the standby period in which the level shifter circuit 1 is in a standby state, the level of the input signal IN turns "L" and so does the level of the output signal OUT, while during the activated period when the level shifter circuit 1 is activated, the level of the input signal turns "H" and so does the level of the output signal.

Figure 3:
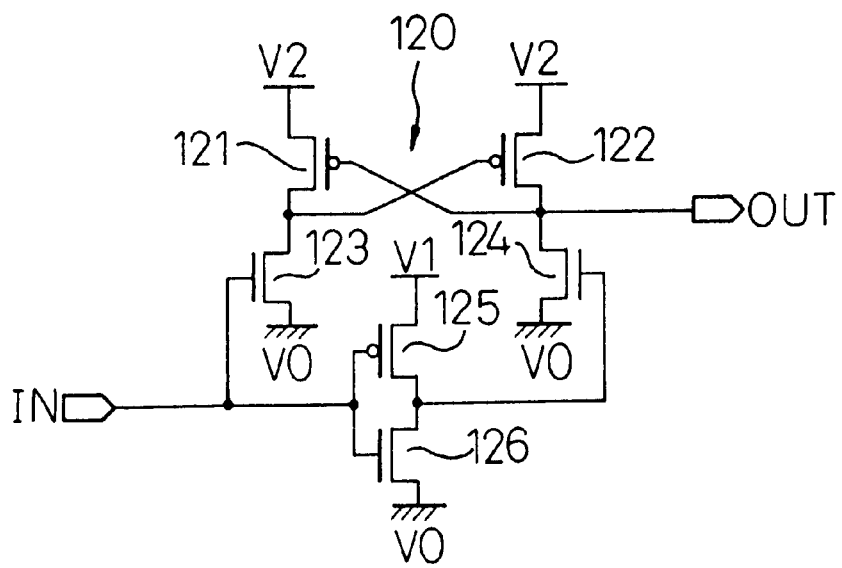
FIG. 3 is a circuit diagram showing a configuration of a second example of the conventional level shifter circuit.

In the level shifter circuit 1 shown in FIG. 4, like the conventional level shifter circuit of FIG. 3, the gates and drains of the first P-ch transistor 10 and the second P-ch transistor 11 for producing an output signal OUT by changing the potential of the input signal IN upward are interconnected by cross coupling. In this case, the potential of the input signal IN is converted from the potential V1 of a first positive power supply to the potential V2 (V1<V2) of a second positive power supply higher than the potential V1.

Further, in the level shifter circuit of FIG. 4, the drain of the first N-ch transistor 12 (i.e., the transistor to which the present invention is applicable) adapted to turn off during the standby period is connected to the gate of a second P-ch transistor 11, and the drain of the second N-ch transistor 13 adapted to turn on during the standby period is connected to the gate of the first P-ch transistor 10. The input signal IN is input to the gate of the first N-ch transistor 12 on the one hand and to the gate of the second N-ch transistor 13 through an inverter including a P-ch transistor 14 and a N-ch transistor 15 connected in complementary fashion at the same time. On the other hand, the output signal OUT is output from the drain of the second P-ch transistor 11.

Furthermore, in the level shifter circuit of FIG. 4, unlike in the conventional level shifter circuit of FIG. 3, the source of the N-ch transistor adapted to turn off during the standby period is connected to the drain of the N-ch transistor 15 in the inverter without being directly connected to the third power supply of ground potential V0. In other words, the source of the N-ch transistor 12 adapted to turn off during the standby period is connected to the first power supply through the drain of the P-ch transistor 14 n the one hand and connected to the third power supply through the drain of the N-ch transistor 15 on the other hand. The P-ch transistor 14 functions as a switching element for changing the source potential of the N-ch transistor during the standby period, and changes the source potential of the N-ch transistor 12 adapted to turn off during the standby period, in a manner such as to apply a negative bias voltage between the gate and source of the N-ch transistor.

More specifically, the input signal IN of "L" level is applied to the N-ch transistor 12 according to the invention during the standby period and to the inverter at the same time. Thus, the P-ch transistor 14 in the inverter turns on while the N-ch transistor 15 turns off. As a result, the source potential of the N-ch transistor 12 is connected to the first power supply through the P-ch transistor 14 during the standby period so that the source potential of the N-ch transistor 12 is kept substantially at the potential of the first power supply (a potential near to the potential of the first power supply). In other words, the source potential of the N-ch transistor 12 during the standby period automatically turns "H" level, so that a negative bias voltage is applied between the gate and source of the N-ch transistor 12. As a result, the sub-threshold current of the N-ch transistor 12 adapted to turn off during the standby period is remarkably reduced.

As is obvious from the first preferred embodiment, the circuit for changing the source potential of the N-ch transistor adapted to turn off during the standby period is effective especially in the case in which the sub-threshold circuit with the N-ch transistor in an off state is larger than the sub-threshold current with the P-ch transistor in an off state.

According to the first preferred embodiment described above, the timing of changing the source potential of the N-ch transistor adapted to turn off during the standby period of the level shifter circuit is normally set in accordance with the potential change of the input signal IN of the level shifter circuit. This timing, however, can alternatively be set in accordance with a predetermined program instruction.

Further, in the first preferred embodiment, one switching element for changing the source potential of one N-ch transistor adapted to turn off during the standby period of the level shifter circuit is assigned to the particular N-ch transistor. In the case in which there a plurality of N-ch transistors adapted to turn off during the standby period, one switching element can be assigned to a plurality of such N-ch transistors. The configuration in which one switching element is assigned to a plurality of N-ch transistors is especially effective for simplifying the semiconductor integrated circuit according to the present invention.

Figure 5:
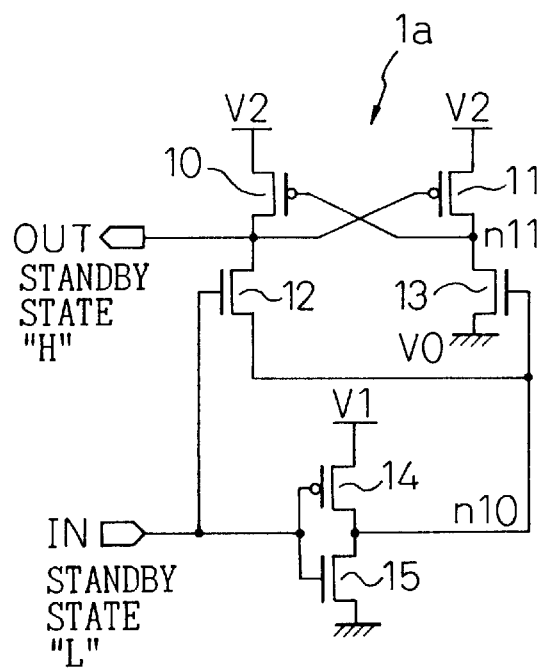
FIG. 5 is a circuit diagram showing a configuration of the modified example of FIG. 4.

FIG. 5 is a circuit diagram showing a configuration of a modified example of FIG. 4. This diagram also illustrates a configuration of the semiconductor integrated circuit in which the invention is applicable to the transistor adapted to turn off during the standby period in the level shifter circuit.

The circuit example shown in FIG. 5 is such that the level of the input signal IN turns "L" and the level of the output signal OUT turns "H" during the standby period of the level shifter circuit 1a, and during the activated period of the level shifter circuit, the level of the input signal turns "H", while the level of the output signal turns "L".

In the level shifter circuit 1a shown in FIG. 5, unlike in FIG. 4, the output signal OUT is output from the drain of the first P-ch transistor 10. The other circuit configuration is identical to that of FIG. 4 and therefore, will not be described in detail.

Also in the modified example shown in FIG. 5, the source potential of the N-ch transistor 12, adapted to turn off during the standby period, is connected to the first power supply through the P-ch transistor 14 functioning as a switching element. The source potential of the N-ch transistor 12, therefore, automatically turns "H", and a negative bias voltage is applied between the gate and source of the N-ch transistor 12. As a result, as in the first preferred embodiment described above, the sub-threshold current of the N-ch transistor 12 adapted to turn off during the standby period can be remarkably reduced.

Figure 6:
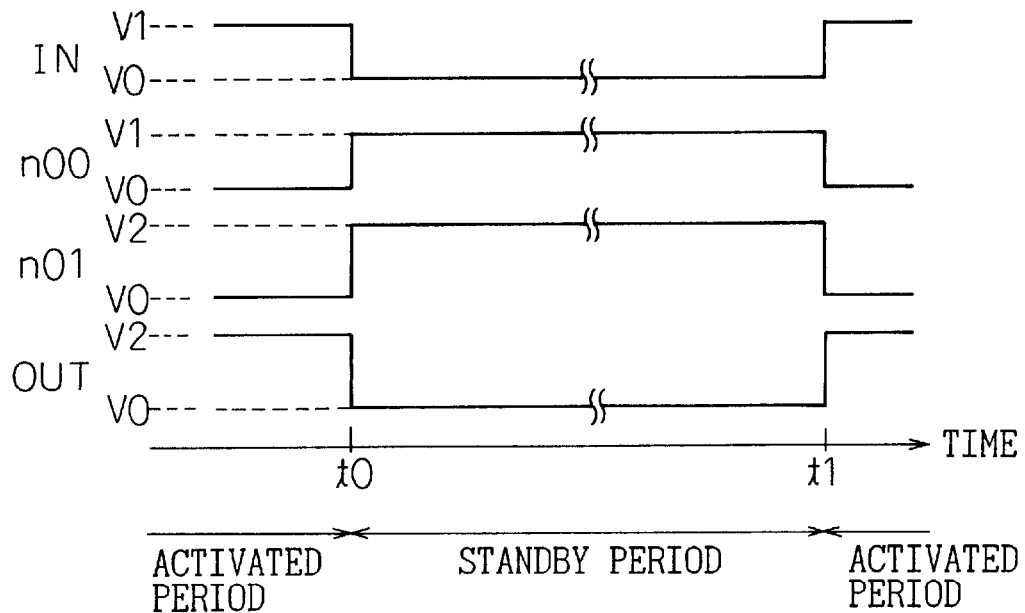
FIG. 6 is a timing chart for explaining the operation of FIG. 4.
Figure 7:
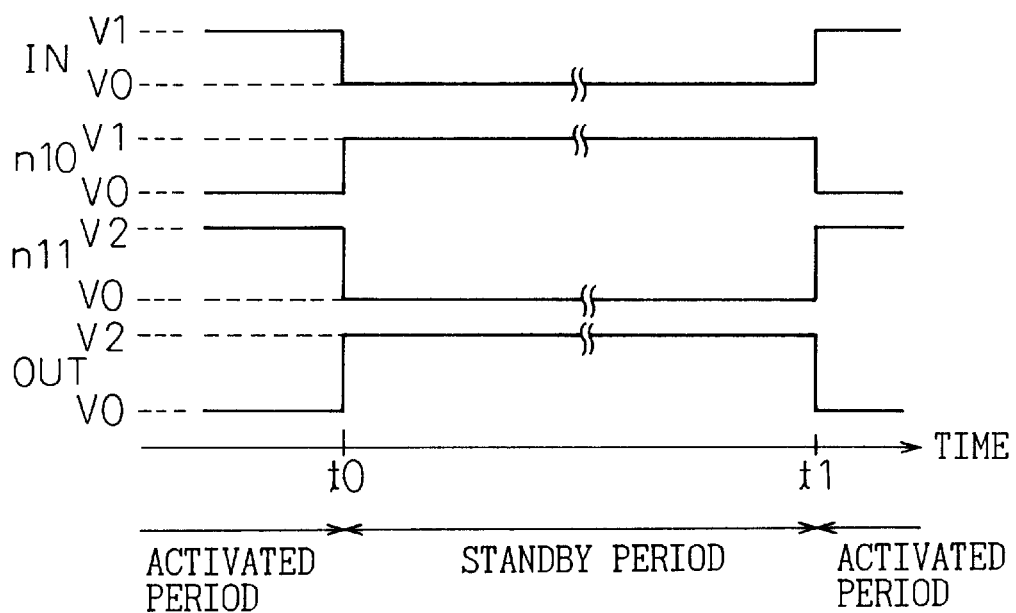
FIG. 7 is a timing chart for explaining the operation of FIG. 5.

FIG. 6 is a timing chart for explaining the operation of FIG. 4. FIG. 7 is a timing chart for explaining the operation of FIG. 5.

In the timing chart shown in FIG. 6, the level of the input signal IN which is "H" during the activated period of the level shifter turns "L" at time point t0 when the activated period transfers to the standby period. Then, the level of the node n00 on the output side of the inverter shown in FIG. 4 turns "H", and so does the level of the node n01 of the drain of the N-ch transistor 12, so that the level shifter circuit enters the standby state. The level of the output signal OUT assumes the inverted form of the signal output from the node n01 and turns from "H" to "L" at time point t0.

At this time, the source of the N-ch transistor 2 is connected to the node n00 on the output side of the inverter including the P-ch transistor 14 and the N-ch transistor 15. Thus, a negative bias voltage is applied between the gate and source of the N-ch transistor 12. On the other hand, when the level of the input signal IN turns "H" at time point t1 when the standby period transfers to the activated period, the level of the node n00 on the output side of the inverter turns "L" and so does the level of the node n01 on the drain side of the N-ch transistor 12. Thus, the desired operation is performed as a normal level shifter circuit. The level of the output signal OUT assumes the inverted form of the signal output from the node n01 and changes from "L" to "H" at time point t1. In a series of operations for controlling the source potential of the N-ch transistor 12 described above, the timing for changing the source potential can also be controlled with the input signal IN alone.

In the timing chart shown in FIG. 7, as in the case of FIG. 6 described above, the level of the input signal IN that has turned "H" during the activated period of the level shifter circuit changes to "L" at time point t0 when the activated period transfers to the standby period. At the same time, the level of the node n10 on the output side of the inverter shown in FIG. 5 turns "H", and the level of the node n11 of the drain of the N-ch transistor 13 turns "L", thus setting the level shifter circuit in the standby state. The level of the output signal OUT assumes the inverted form of the signal output from the node n11 and changes from "L" to "H" at time point t0.

At this time, the source of the N-ch transistor 12 is connected to the node n10 on the output side of the inverter including the P-ch transistor 14 and the N-ch transistor 15. Therefore, a negative bias voltage is applied between the gate and source of the N-ch transistor 12. On the other hand, when the level of the input signal IN turns "H" at time point t1 when the standby period changes to the activated period, the level of the node n11 on the drain side of the N-ch transistor 13 turns "H". Thus, the desired operation is performed as a normal level shifter circuit. The level of the output signal OUT assumes the inverted form of the signal output from the node n11 and changes from "H" to "L" at time point t1. Also in the series of operations for controlling the source potential of the N-ch transistor 12, as in the case of FIG. 3, the timing of changing the source potential can be controlled only with the input signal IN.

Figure 8:
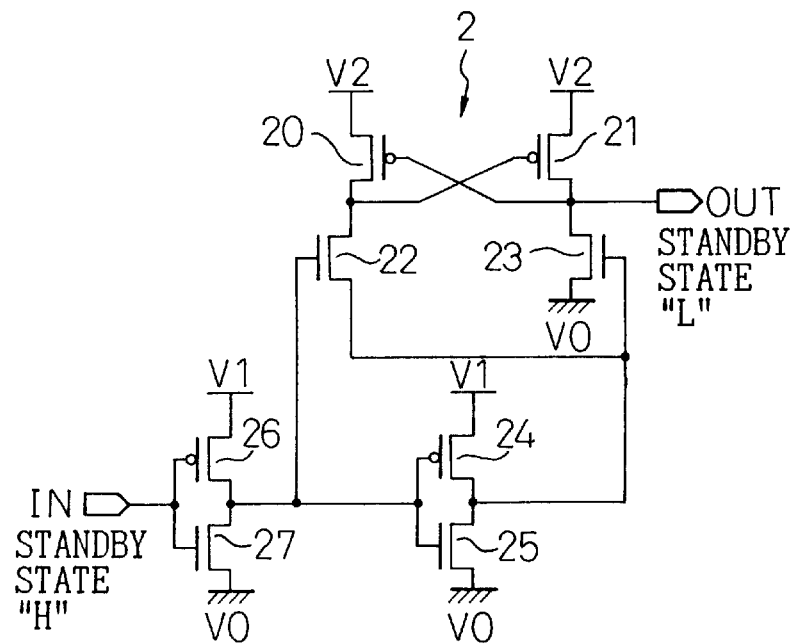
FIG. 8 is a circuit diagram showing a configuration according to a second preferred embodiment of the present invention.

FIG. 8 is a circuit diagram showing a configuration of a second preferred embodiment of the present invention. This also illustrates a configuration of the semiconductor integrated circuit in which the present invention is applicable to the transistor adapted to turn off during the standby period in the level shifter circuit.

In the second preferred embodiment of FIG. 8, the input signal IN has a different polarity than the input signal IN in the first embodiment. This embodiment shows a circuit example in which the level of the input signal IN turns "H" during the standby period of the level shifter circuit 2 while the level of the input signal IN turns "L" during the activated period of the level shifter circuit. In this case, however, the level of the output signal OUT, as in the first preferred embodiment described above, turns "L" during the standby period of the level shifter and turns "H" during the activated period of the same level shifter circuit.

Further, in the level shifter circuit 2 shown in FIG. 8, as in the level shifter circuit shown in FIG. 4, the gates and the drains of the first P-ch transistor 20 and the second P-ch transistor 21 for producing the output signal OUT by changing the potential of the input signal IN upward are interconnected by cross coupling. In this case, the potential of the input signal IN is converted from the potential V1 of the first positive power supply upward to the potential V2 of the second positive power supply higher than the first positive power supply V1.

Furthermore, in the level shifter circuit of FIG. 8, the drain of the first N-ch transistor 22 (i.e., the transistor to which the present invention is applicable) adapted to turn off during the standby period is connected to the gate of the second P-ch transistor 21 on the one hand and the drain of the second N-ch transistor 23 adapted to turn on during the standby period is connected to the gate of the first P-ch transistor 20 at the same time.

The input signal IN is input to the gate of a first N-ch transistor 22 after being inverted in polarity by an inverter including a P-ch transistor 26 and a N-ch transistor 27. At the same time, the input signal IN is input to the gate of the second N-ch transistor 23 through an inverter including the P-ch transistor 24 and the N-ch transistor 25. On the other hand, the output signal OUT is output from the drain of the second P-ch transistor 21. In other words, the level shifter circuit of FIG. 8 is a circuit in which one stage represented by an inverter including a P-ch transistor and a N-ch transistor is added on the input side of the first embodiment shown in FIG. 4.

Further, in the level shifter circuit of FIG. 8, as in the level shifter circuit of FIG. 4 described above, the source of the N-ch transistor 22 adapted to turn off during the standby period is not connected directly to the third power supply of ground potential V0 but connected to the drain of the N-ch transistor 25 in the inverter. In other words, the source of the N-ch transistor 22 adapted to turn off during the standby period is connected to the first power supply through the drain of the P-ch transistor 24 on the one hand and to the third power supply through the drain of the N-ch transistor 25 at the same time. The P-ch transistor 24 functions as a switching element for changing the source potential of the N-ch transistor during the standby period, and changes the source potential of the N-ch transistor 22 adapted to turn off during the standby period in such a manner that a negative bias voltage is applied between the gate and source of the N-ch transistor.

More specifically, the input signal IN of "H" level is input to the N-ch transistor 22 according to the invention after being inverted by an inverter including the P-ch transistor 26 and the N-ch transistor 27. At the same time, the input signal IN is input to the inverter including the P-ch transistor 24 and the N-ch transistor 25, and therefore the P-ch transistor 24 in the inverter turns on while the N-ch transistor 25 turns off. As a result, the source potential of the N-ch transistor 22 is connected to the first power supply through the P-ch transistor 24 during the standby period and kept at the potential near to the potential of the first power supply. Specifically, the source potential of the N-ch transistor 22 during the standby period automatically turns "H" so that a negative bias voltage is applied between the gate and source of the N-ch transistor 22. As a result, as in the first embodiment described above, the sub-threshold current of the N-ch transistor adapted to turn off during the standby period can be remarkably reduced.

Figure 9:
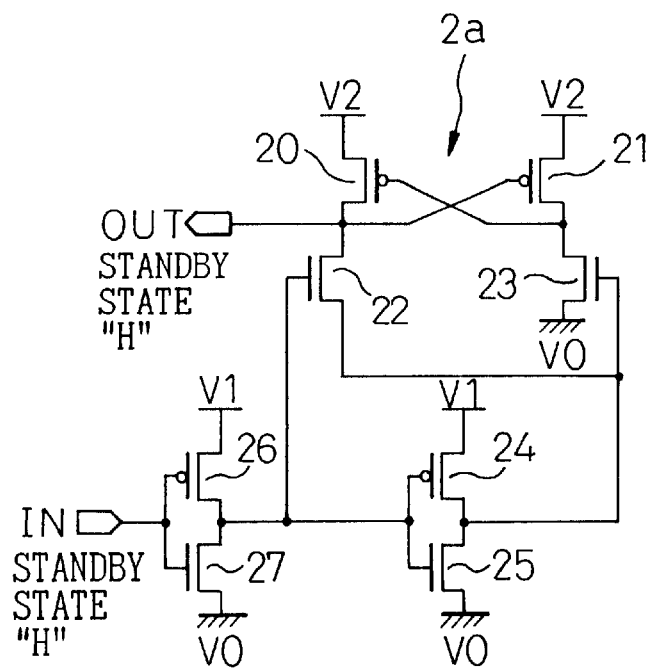
FIG. 9 is a circuit diagram showing a configuration of the modified example of FIG. 8.

FIG. 9 is a circuit diagram showing a configuration of a modified example of FIG. 8. This also illustrates a configuration of a semiconductor integrated circuit in the case in which the present invention is applicable to a transistor adapted to turn off during the standby period in the level shifter circuit.

In FIG. 9, a circuit example is shown in which during the standby period of the level shifter circuit 2a, the level of the input signal IN turns "H" and so does the level of the output signal OUT, while during the activated period of the level shifter circuit, the level of the input signal turns "L" and so does the level of the output signal.

In the level shifter circuit 2a shown in FIG. 9, unlike the case of FIG. 8, the output signal OUT is output from the drain of a first P-ch transistor 20. The other circuit configuration remains the same as that of FIG. 8 described above and will not be described in detail.

Also in the modified example shown in FIG. 9, the source potential of the N-ch transistor 22 adapted to turn off during the standby period is connected to the first power supply through the P-ch transistor 24 functioning as a switching element and therefore automatically turns "H", so that a negative bias voltage is imposed between the gate and source of the N-ch transistor 22. As a result, as in the second embodiment described above, the sub-threshold current of the N-ch transistor 22 adapted to turn off during the standby period can be considerably reduced.

Figure 10:
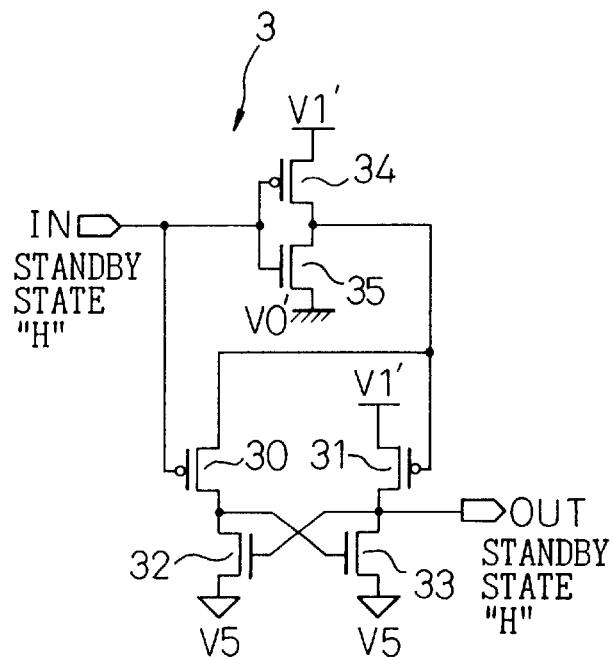
FIG. 10 is a circuit diagram showing a configuration according to a third preferred embodiment of the present invention.

FIG. 10 is a circuit diagram showing a configuration of a third preferred embodiment of the present invention. This also illustrates a configuration of the semiconductor integrated circuit in which the present invention is applicable to the transistor adapted to turn off during the standby period in the level shifter circuit.

In FIG. 10, a circuit example is shown in which during the standby period when the level shifter circuit 3 is in a standby state, the level of the input signal IN turns "H" and so does the level of the output signal OUT, while during the activated period when the level shifter circuit 3 is activated, the level of the input signal turns "L" and so does the level of the output signal.

In the level shifter circuit 3 shown in FIG. 10, the gates and the drains of the first N-ch transistor 32 and the second N-ch transistor 33 for producing an output signal OUT by changing the potential of the input signal IN downward are interconnected by cross coupling. In this case, the potential of the input signal IN is changed from the potential V0' of the negative power supply or the fourth ground potential to the potential V5 of the fifth negative power supply lower than the potential V0' (V0'>V5: V0' and V5 are zero or negative in value).

Further, in the level shifter circuit of FIG. 10, the drain of the first P-ch transistor (i.e., the transistor to which the present invention is applicable) adapted to turn off during the standby period is connected to the gate of the second N-ch transistor 33, and the drain of the second P-ch transistor 31 adapted to turn on during the standby period is connected to the gate of the first N-ch transistor 32. In this case, the input signal IN is input to the gate of the first P-ch transistor 30 and also, input to the gate of the second P-ch transistor 31 through an inverter including the P-ch transistor 34 and the N-ch transistor 35 connected in a complementary form. On the other hand, the output signal OUT is output from the drain of the second N-ch transistor 33.

Further, in the level shifter circuit of FIG. 10, unlike the conventional level shifter circuit (FIG. 3) described above, the source of the P-ch transistor 30 adapted to turn off during the standby period is not connected directly to the sixth power supply (such as potential V1') but connected to the drain of the P-ch transistor 34 in the inverter. In other words, the source of the P-ch transistor 30 adapted to turn off during the standby period is connected to the fourth power supply through the drain of the N-ch transistor 35 and to the sixth power supply through the drain of the P-ch transistor 34 at the same time. The N-ch transistor 35 functions as a switching element for changing the source potential of the P-ch transistor during the standby period and changes the source potential of the P-ch transistor 30 adapted to turn off during the standby period in such a manner as to apply a positive bias voltage between the gate and source of the P-ch transistor.

More specifically, during the standby period, the "H" level input signal IN is input to the P-ch transistor 30 according to this invention and also, input to the inverter. Thus, the N-ch transistor 35 in the inverter is turned on while the P-ch transistor 34 turns off. As a result, the source potential of the P-ch transistor 30 is connected to the fourth power supply through the N-ch transistor 35 during the standby period and is kept at the potential substantially equal to the potential of the fourth power supply. Specifically, during the standby period, the source potential of the P-ch transistor 30 automatically turns "L", so that a positive bias voltage is applied between the gate and source of the P-ch transistor 30. As a result, the sub-threshold current of the P-ch transistor 30 adapted to turn off during the standby period can be remarkably reduced.

As shown in the third embodiment described above, a circuit for changing the source potential of the P-ch transistor adapted to turn off during the standby period is effective especially in the case in which the sub-threshold current in an off state between the gate and source of the P-ch transistor is larger than the sub-threshold current in an off state of the N-ch transistor.

In the third preferred embodiment described above, the timing of changing the source potential of the P-ch transistor adapted to turn off during the standby period of the level shifter circuit is set in accordance with the potential change of the input signal IN to the level shifter circuit but can alternatively be set in accordance with a predetermined program instruction.

Further, in the third preferred embodiment, one switching element for changing the source potential of one of the P-ch transistors adapted to turn off during the standby period of the level shifter circuit is assigned to the particular P-ch transistor. In the case in which there are a plurality of P-ch transistors adapted to turn off during the standby period, however, it is also possible to assign one switching element to a plurality of the P-ch transistors. The configuration of assigning one switching element to a plurality of P-ch transistors in this way is effective especially for simplifying the semiconductor integrated circuit according to the present invention.

Figure 11:
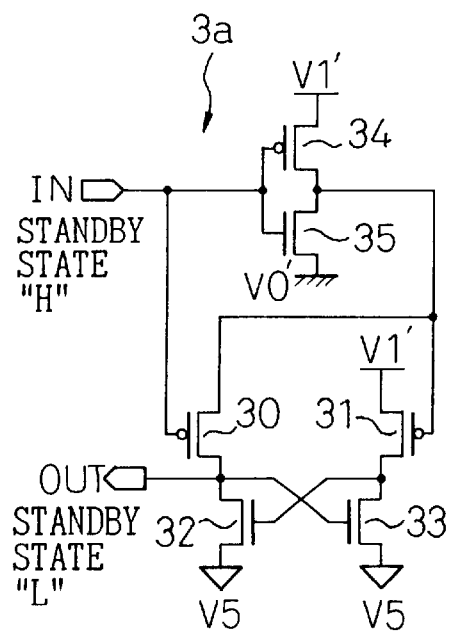
FIG. 11 is a circuit diagram showing a configuration of the modified example of FIG. 10.

FIG. 11 is a circuit diagram showing a configuration of the modified example of FIG. 10. This modified example also illustrates a configuration of a semiconductor integrated circuit including a transistor according to the present invention which is adapted to turn off during the standby period in the level shifter circuit.

In FIG. 11, a circuit example is shown in which during the standby period of the level shifter circuit 3a, the level of the input signal IN turns "H", and the level of the output signal OUT turns "L", while during the activated period of the level shifter circuit, the level of the particular input signal turns "L" while the output signal level turns "H".

In the level shifter circuit 3a shown in FIG. 11, unlike in the circuit of FIG. 10, the output signal OUT is output from the drain of the first N-ch transistor 32. The other circuit configuration is the same as that of FIG. 10 described above and therefore will not be described in detail.

In the modified example shown in FIG. 11 also, the source potential of the P-ch transistor 30 adapted to turn off during the standby period is connected to the fourth power supply through the N-ch transistor 35 functioning as a switching element and therefore automatically turns "L", so that a positive bias voltage is applied between the gate and source of the P-ch transistor 30. As a result, as in the case of the third preferred embodiment described above, the sub-threshold current of the P-ch transistor 30 adapted to turn off during the standby period can be remarkably reduced.

Figure 12:
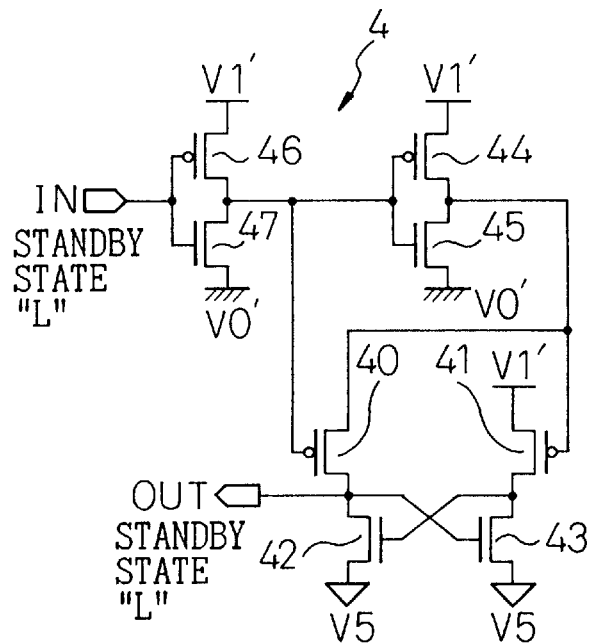
FIG. 12 is a circuit diagram showing a configuration according to a fourth preferred embodiment of the present invention.

FIG. 12 is a circuit diagram showing a configuration of a fourth preferred embodiment of the present invention. This also shows a configuration of a semiconductor integrated circuit including a transistor according to the present invention which is adapted to turn off during the standby period in the level shifter circuit.

In the fourth preferred embodiment of FIG. 12, a circuit example is shown in which the polarity of the input signal IN is different from that in the third preferred embodiment described above, and the level of the input signal IN turns "L" and so does the level of the output signal OUT during the standby period of the level shifter circuit 4, while the level of the input signal IN turns "H" and so does the level of the output signal OUT during the activated period of the level shifter circuit.

Further, in the level shifter circuit 4 of FIG. 12, like the level shifter circuit of FIG. 10 described above, the gates and the drains of the first N-ch transistor 42 and the second N-ch transistor 43 for producing an output signal OUT by changing the potential of the input signal IN downward are interconnected by cross coupling. In this case, the potential of the input signal IN is changed from the fourth ground potential or the potential V0' of a negative power supply to the potential V5 of a fifth negative power supply lower than the potential V0'.

Furthermore, in the level shifter circuit of FIG. 12, the drain of the first P-ch transistor (i.e., the transistor according to this invention) adapted to turn off during the standby period is connected to the gate of the second P-ch transistor 41, while the drain of the second P-ch transistor adapted to turn on during the standby period is connected to the gate of the first N-ch transistor 42.

The input signal IN is input to the gate of the first P-ch transistor 40 after the polarity thereof is inverted by an inverter including the P-ch transistor 46 and the N-ch transistor 47. At the same time, the input signal IN is input to the gate of the second P-ch transistor 41 through an inverter including the P-ch transistor 44 and the N-ch transistor 45. On the other hand, the output signal OUT is output from the drain of the first N-ch transistor 42. In other words, the level shifter circuit of FIG. 12 is a circuit further including a stage of inverter including a P-ch transistor and a N-ch transistor on the input side of the level shifter circuit of FIG. 11.

In addition, in the level shifter circuit of FIG. 12, like the level shifter circuit of FIG. 10 described above, the source of the P-ch transistor 40 adapted to turn off during the standby period is not directly connected to the sixth power supply (such as the potential V1') but is connected to the drain of the P-ch transistor 44 in the inverter. In other words, the source of the P-ch transistor 40 adapted to turn off during the standby period is connected to the fourth power supply (such as the potential V0') through the drain of the N-ch transistor 45 and connected to the sixth power supply through the drain of the P-ch transistor 44. The N-ch transistor 45 functions as a switching element for changing the source potential of the P-ch transistor during the standby period and changes the source potential of the P-ch transistor adapted to turn off during the standby period so as to apply a positive bias voltage between the gate and source of the P-ch transistor.

More specifically, during the standby period, the "L" level input signal IN is input to the P-ch transistor 40 according to the present invention after being inverted by the inverter including the P-ch transistor 46 and the N-ch transistor 47. At the same time, the input signal IN is input to the inverter including the P-ch transistor 44 and the N-ch transistor 45. Thus, the P-ch transistor 44 in the inverter turns off while the N-ch transistor 45 turns on. As a result, the source potential of the P-ch transistor 40 is connected to the fourth power supply through the N-ch transistor 45 during the standby period and kept at the potential substantially equal to the potential of the fourth power supply. In other words, the source potential of the P-ch transistor 40 during the standby period automatically turns "L", so that a positive bias voltage is applied between the gate and source of the P-ch transistor 40. As a result, as in the case of the third embodiment described above, the sub-threshold current of the P-ch transistor 40 adapted to turn off during the standby period can be remarkably reduced.

Figure 13:
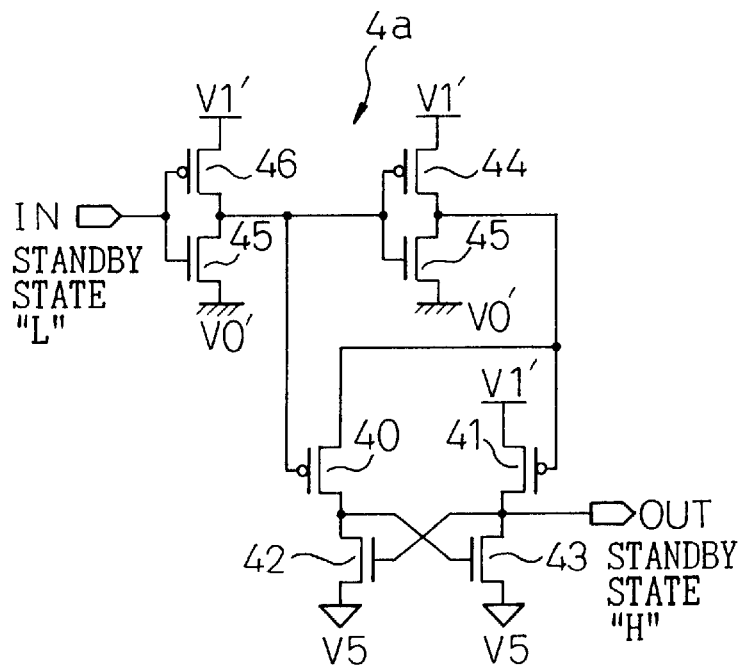
FIG. 13 is a circuit diagram showing a configuration of the modified example of FIG. 12.

FIG. 13 is a circuit diagram showing a configuration of a modified example of FIG. 12. This also shows a configuration of the semiconductor integrated circuit including a transistor according to the present invention which is adapted to turn off during the standby period in the level shifter circuit.

In FIG. 13, a circuit example is shown in which during the standby period of the level shifter circuit 4a, the level of the input signal IN turns "L" and the level of the output signal OUT turns "H", while during the activated period of the level shifter circuit, the level of the input signal turns "H" and the level of the output signal turns "L".

In the level shifter circuit 4a shown in FIG. 13a, unlike in the circuit of FIG. 12 described above, the output signal OUT is output from the drain of the second N-ch transistor 43. The other circuit configuration is the same as that of FIG. 12 and will not be described in detail.

In the modified example shown in FIG. 13, too, the source potential of the P-ch transistor 40 adapted to turn off during the standby period is connected to the fourth power supply through the N-ch transistor functioning as a switching element, and therefore automatically turns "L" so that a positive bias voltage is applied between the gate and source of the N-ch transistor 40. As a result, as in the fourth preferred embodiment described above, the sub-threshold current of the P-ch transistor 40 adapted to turn off during the standby period can be remarkably reduced.

Figure 2:
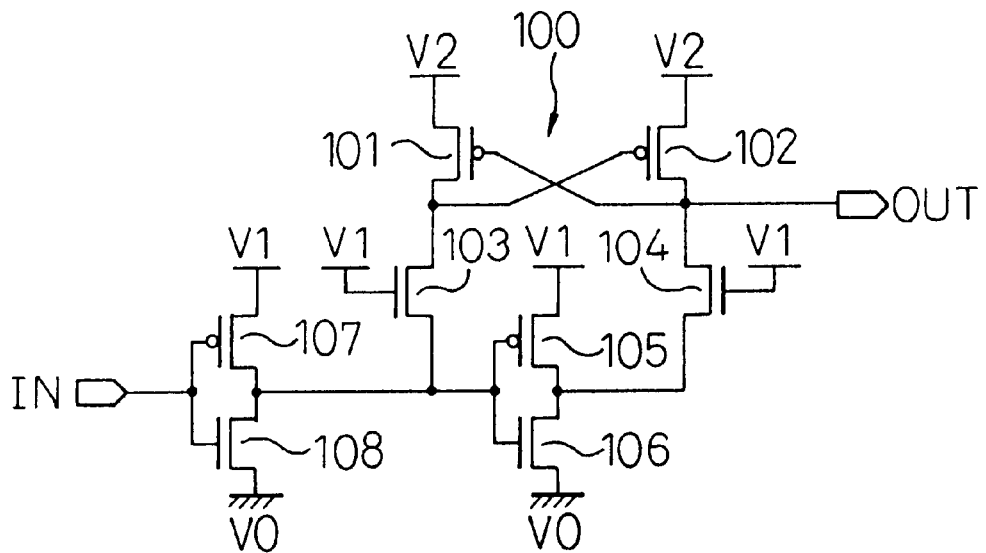
FIG. 2 is a circuit diagram showing a configuration of a first example of the conventional level shifter circuit.

The first to fourth preferred embodiments (FIGS. 4 to 13) described above are different from the level shifter circuit according to the first and second conventional circuits shown in FIGS. 2 and 3. The reason is that no conventional circuit exists in which N-ch transistors in series which are turned on/off by a signal changing in state at timings are connected to a power supply of the ground potential, or similar P-ch transistors in series are connected to a positive power supply.

As described above, the circuit included in each of the first to fourth embodiments of the present invention can effectively reduce the sub-threshold current during the standby period by a similar operation to the prior art.

Figure 14:
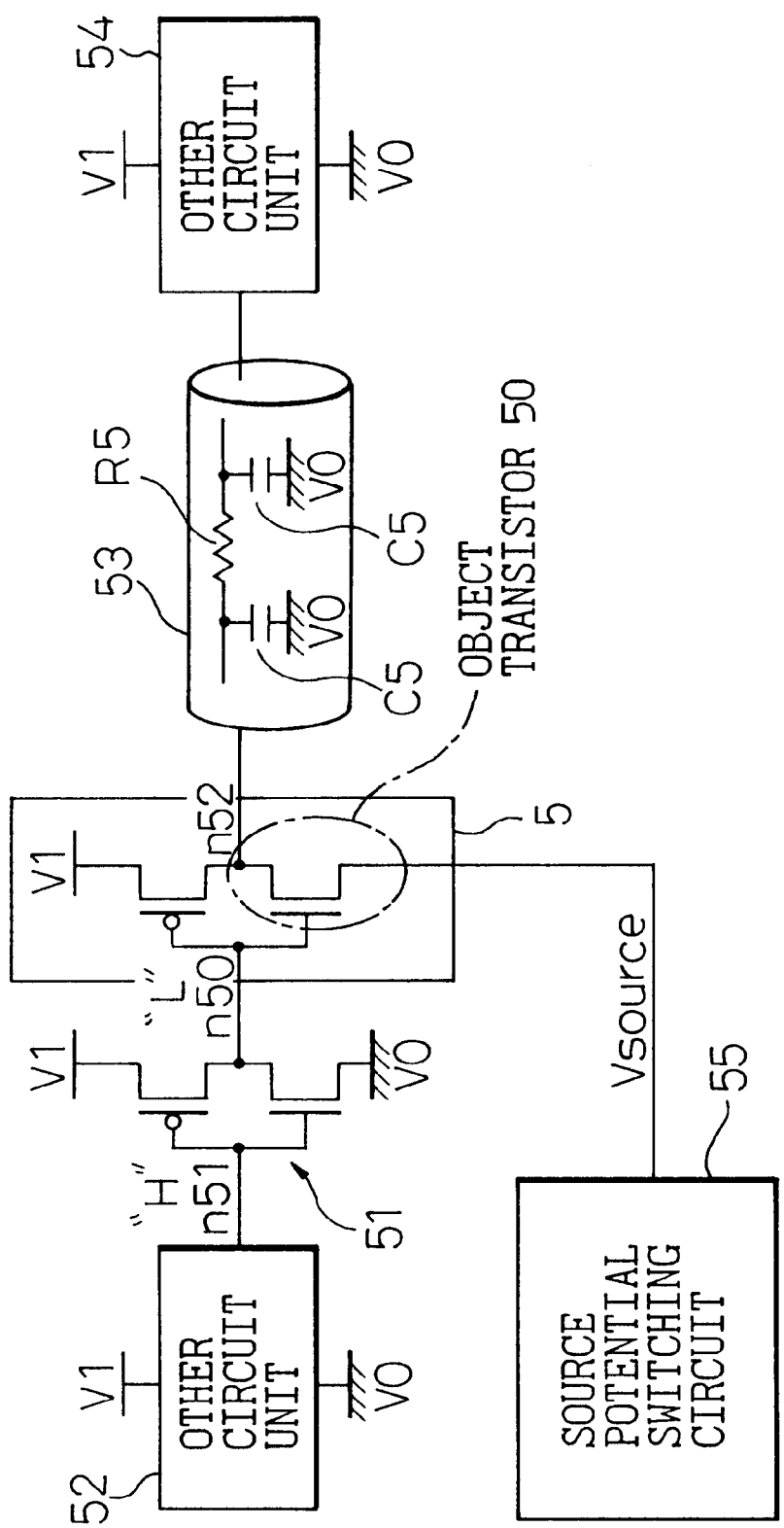
FIG. 14 is a circuit diagram showing a configuration of a fifth preferred embodiment of the present invention.

FIG. 14 is a circuit diagram showing a fifth preferred embodiment of the present invention. This diagram shows a configuration of a semiconductor integrated circuit including a transistor according to the present invention adapted to turn off during the standby period, in a driver transistor circuit including a main driver transistor circuit and a pre-stage driver transistor circuit located in the stage before the main driver transistor circuit. Further, this diagram represents the case in which the threshold current with the N-ch transistor in an off state is larger than that with the P-ch transistor in an off state.

In FIG. 14, to simplify the explanation, the circuit unit (such as the circuit units 52, 54) other than the main driver transistor circuit 5 and the pre-stage driver transistor circuit 51 are not described in detail. The main driver transistor circuit 5 includes an inverter having a N-ch transistor and a P-ch transistor for driving a wiring unit 53 of the semiconductor integrated circuit represented by a distributed capacitor C5 and a distributed resistor R5. In this case, the source of the P-ch transistor is connected to a positive power supply of the potential V1, for example, and the drain thereof is connected to the drain of the N-ch transistor. Further, the source of the N-ch transistor is connected not directly to the power supply of the ground potential V0, for example, but connected to the source potential switching circuit 55. On the other hand, the pre-stage driver transistor circuit 51 also includes an inverter having a N-ch transistor and a P-ch transistor.

In this case, in the case in which the level of the node n51 is "H" during the standby period, the N-ch transistor in the pre-stage driver transistor circuit 51 is in an on state. At the same time, the level of the node n50 turns "L", and the N-ch transistor in the main driver transistor circuit 5 turns off. As a result, in this case, the N-ch transistor in the main driver transistor circuit 5 corresponds to the object transistor 50 according to the present invention.

In the fifth preferred embodiment shown in FIG. 14, the source of only the object transistor 50 constituting a N-ch transistor adapted to turn off during the standby period is connected to the source potential switching circuit 55. This source potential switching circuit 55 functions as a switching element for changing the source potential of the N-ch transistor during the standby period, and supplies a voltage $V_{source}$ for changing the source potential of the object transistor 50 in such a manner that a negative bias voltage is applied between the gate and source of the N-ch transistor.

In other words, the source potential of the object transistor 50 during the standby period automatically becomes higher level ("H"), so that a negative bias voltage is applied between the gate and source of the object transistor 50. As a result, the sub-threshold current of the object transistor 50 constituting the N-ch transistor adapted to turn off during the standby period is remarkably reduced.

As shown in the fifth preferred embodiment described above, the source potential switching circuit for changing the source potential of the N-ch transistor adapted to turn off during the standby period of the driver transistor circuit produces a larger effect especially in the case in which the sub-threshold current with the N-ch transistor in an off state is larger than the sub-threshold current with the P-ch transistor in an off state.

In the fifth preferred embodiment, the timing of changing the source potential of the N-ch transistor (object transistor 50) adapted to turn off during the standby period of the driver transistor circuit is set in accordance with the potential change of the input signal (potential of node n50) to the main driver transistor circuit but can alternatively be set in accordance with a predetermined program instruction.

Further, in the fifth preferred embodiment, one source potential switching circuit for changing the source potential of one of the N-ch transistors adapted to turn off during the standby period of the main driver transistor circuit is assigned to the particular N-ch transistor. In the case in which there are a plurality of N-ch transistors adapted to turn off during the standby period, however, it is also possible to assign one source potential switching circuit to a plurality of the N-ch transistors. The configuration of assigning one source potential switching circuit to a plurality of N-ch transistors is effective especially for simplifying the present semiconductor integrated circuit according to the present invention.

Figure 15:
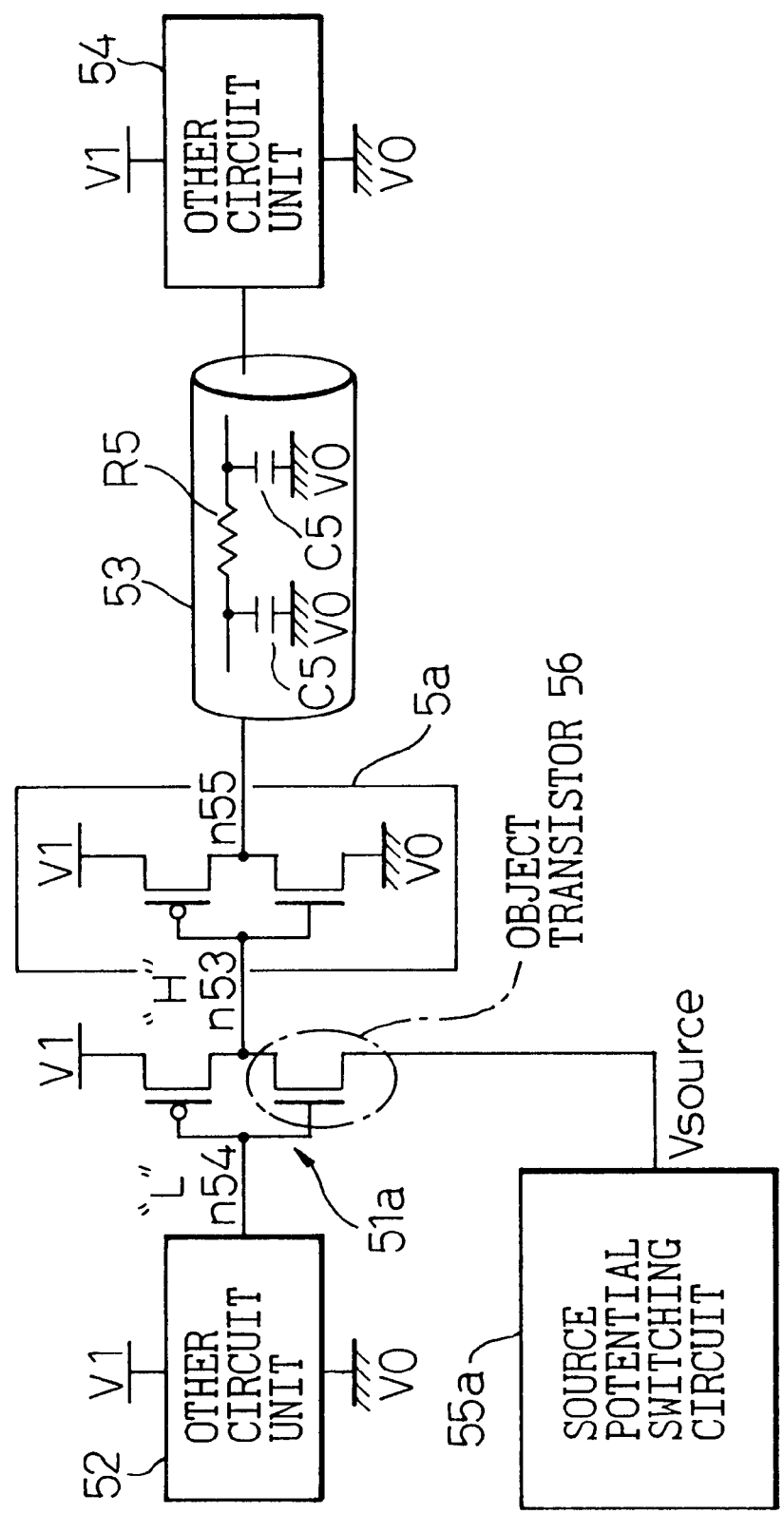
FIG. 15 is a circuit diagram showing a configuration of the modified example of FIG. 14.

FIG. 15 is a circuit diagram showing a configuration of the modified example of FIG. 14. This diagram also shows a configuration of the semiconductor integrated circuit with an object transistor adapted to turn off during the standby period, in a driver transistor circuit including a main driver transistor circuit and a pre-stage driver transistor circuit located in the stage before the main driver transistor circuit. Further, this diagram shows the case in which the sub-threshold current with the N-ch transistor in an off state is larger than the sub-threshold current with the P-ch transistor in an off state.

In FIG. 15, too, as in the case of FIG. 14 described above, the main driver transistor circuit 5a includes an inverter having a N-ch transistor and a P-ch transistor for driving the wiring unit 53. Further, the pre-stage driver transistor circuit 51a located in the stage before the main driver transistor circuit 5a also includes an inverter having a N-ch transistor and a P-ch transistor.

Further, in FIG. 15, the level of the node n54 turns "L" during the standby period, and therefore the N-ch transistor in the pre-stage driver transistor circuit 51a turns off. At this time, the level of the node n53 turns "H" and the N-ch transistor in the main driver transistor circuit 5a turns on. In this case, therefore, the N-ch transistor in the pre-stage driver transistor circuit 51a corresponds to the object transistor 56 according to the present invention. The source of the P-ch transistor in the pre-stage driver transistor circuit 51a is connected to a positive power supply of potential V1, for example, and the drain thereof is connected to the drain of the N-ch transistor (object transistor 56). Further, the source of the N-ch transistor is connected not directly to the power supply of ground potential V0, for example, but to the source potential switching circuit 55a.

In the modified example shown in FIG. 15, the source of only the object transistor 56 constituting a N-ch transistor adapted to turn off during the standby period is connected to the source potential switching circuit 55a. This source potential switching circuit 55a functions as a switching element for changing the source potential of the N-ch transistor during the standby period and supplies a voltage $V_{source}$ for changing the source potential of the object transistor 56 in such a manner that a negative bias voltage is applied between the gate and source of the N-ch transistor.

In other words, the source potential of the object transistor 56 during the standby period automatically turns "H", so that a negative bias voltage is applied between the gate and source of the object transistor 56. As a result, the sub-threshold current of the object transistor 56 constituting the N-ch transistor adapted to turn off during the standby period is remarkably reduced.

Figure 16:
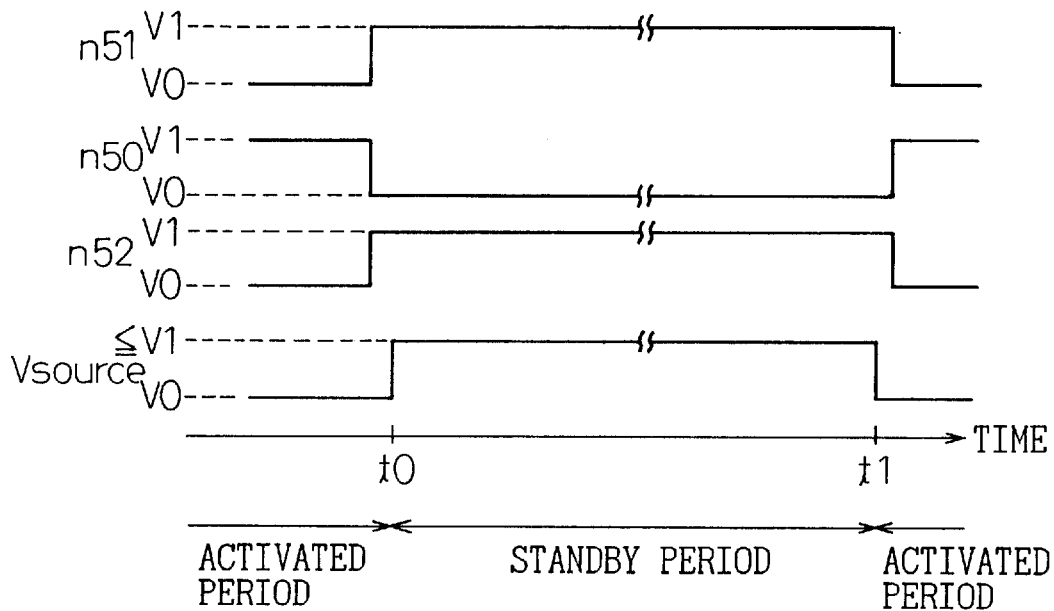
FIG. 16 is a timing chart for explaining the operation of FIG. 14.
Figure 17:
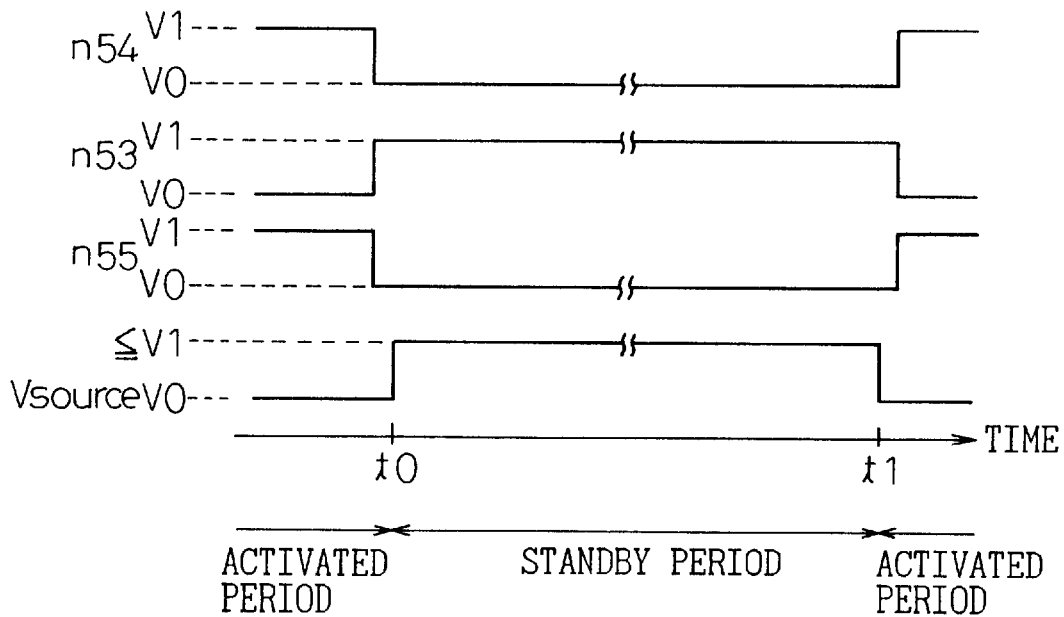
FIG. 17 is a timing chart for explaining the operation of FIG. 15.

FIG. 16 is a timing chart for explaining the operation of the circuit shown in FIG. 14, and FIG. 17 a timing chart for explaining the operation of the circuit shown in FIG. 15.

In the timing chart shown in FIG. 16, the level of the voltage $V_{source}$ output from the source potential switching circuit 55 is in "L" state during the activated period of the driver transistor circuit, and the main driver transistor circuit 5 performs the desired operation as an inverter. During this activated period, the level of the node n51 on the input side of the preceding-stage driver transistor circuit 51 turns "L", while the level of the node n50 on the input side of the main driver transistor circuit 5 turns "H" and the level on the output side of the main driver transistor circuit 5 turns "L". After that, upon expiry of the activated period at time point t0, the voltage $V_{source}$ is increased to the potential V1 of the positive power supply or a potential lower than the potential V1, so that a negative bias voltage is applied between the gate and source of the N-ch transistor in the main drive transistor circuit thereby to reduce the sub-threshold current of the N-ch transistor.

After that, during the standby period of the driver transistor circuit, the level of the node n50 on the input side of the pre-stage driver transistor circuit turns "H", the level of the node n50 on the input side of the main driver transistor circuit turns "L" and the level on the output side of the main driver transistor circuit turns "H". In this case, the potential of the voltage $V_{source}$ output from the source potential switching circuit 55 is determined by the configuration of a specific circuit in the source potential switching circuit 55. Further, at time point t1, the level of the voltage $V_{source}$ is turned "L" again, thereby making it possible to perform a normal circuit operation.

The fourth preferred embodiment described above represents the case in which the potential of the voltage $V_{source}$ is changed at the start and end of the activated period without synchronizing with the signal propagating from the node n50 through the node n52. It is also possible, however, to change the potential of $V_{source}$ at such a timing as to synchronize with the signal.

Also in the timing chart shown in FIG. 17, as in the case of FIG. 16 described above, the level of the voltage $V_{source}$ output from the source potential switching circuit 55a is "L" during the activated period of the driver transistor circuit and the pre-stage driver transistor circuit 51a performs the desired operation as an inverter. During the activated period, unlike in the case of FIG. 16, the level of the node n54 on the input side of the pre-stage driver transistor circuit 51a turns "H", the level of the node n53 on the input side of the main driver transistor circuit 5a turns "L", and the level on the output side of the main driver transistor circuit 5a turns "H". After that, upon expiry of the activated period at time point t0, the voltage $V_{source}$ is increased to the potential V1 of the positive power supply or a potential lower than potential V1, so that a negative bias voltage is applied between the gate and source of the N-ch transistor in the pre-stage driver transistor circuit thereby to reduce the sub-threshold current of the N-ch transistor.

After that, during the standby period of the driver transistor circuit, the level of the node n54 on the input side of the pre-stage driver transistor circuit turns "L", the level of the node n53 on the input side of the main driver transistor circuit turns "H", and the level on the output side of the main driver transistor circuit turns "L". At this time, the potential of the voltage $V_{source}$ output from the source potential switching circuit 55 is determined by a specific internal circuit configuration of the source potential switching circuit 55a. Further, by turning the level of the voltage $V_{source}$ to "L" again at time point t1, the normal circuit operation can be performed.

The modified example explained with reference to FIGS. 15 and 17 represents the case in which the potential of the $V_{source}$ at the start and end of the activated period is changed without synchronizing with the signal propagating from the node n53 through the node n55, as in the fourth preferred embodiment previously described with reference to FIGS. 14 and 16. As an alternative, it is possible to change the potential of $V_{source}$ at such a timing as to synchronize with the signal.

Figure 18:
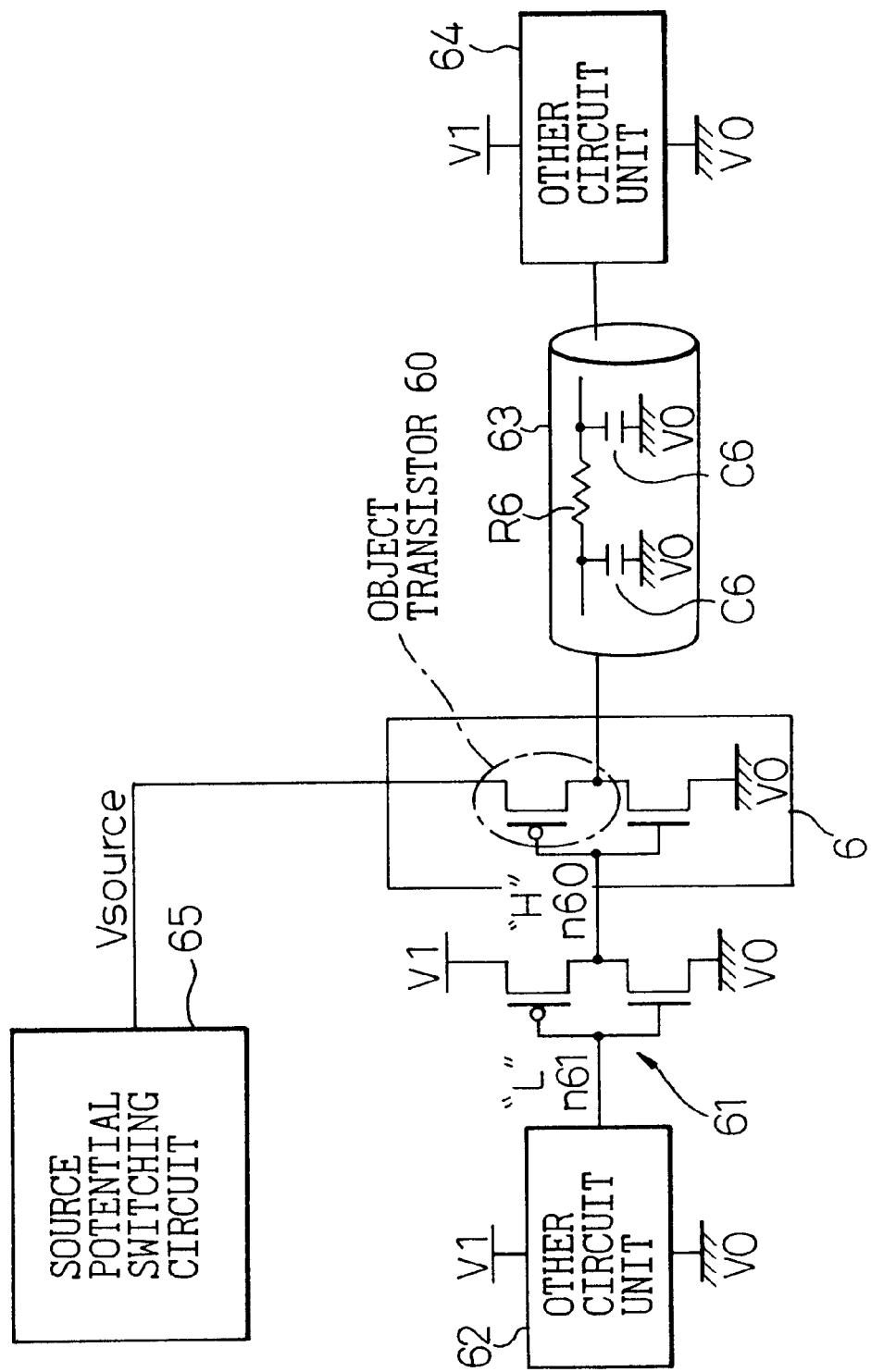
FIG. 18 is a circuit diagram showing a configuration of a sixth preferred embodiment of the present invention.

FIG. 18 is a circuit diagram showing a sixth preferred embodiment of the present invention. This diagram, like the case of FIG. 1 described above, illustrates a configuration of the semiconductor integrated circuit including an object transistor according to the present invention adapted to turn off during the standby period in a driver transistor circuit comprising a main driver transistor circuit and a pre-stage driver transistor circuit located in the stage before the main driver transistor circuit. In this case, however, the sub-threshold current is larger for the P-ch transistor in an off state than for the N-ch transistor in an off state.

In FIG. 18, for simplifying the explanation, the circuits (such as other circuits 62, 64) other than the main driver transistor circuit 6 and the pre-stage driver transistor circuit 61 are not described in detail. The main driver transistor circuit 6 includes an inverter having a N-ch transistor and a P-ch transistor for driving the wiring unit 63 of the semiconductor integrated circuit represented by a distributed capacitor C6 and a distributed resistor R6. In this case, the source of the N-ch transistor is connected to the power supply of ground potential V0, for example, and the drain thereof is connected to the drain of the P-ch transistor. Further, the source of the P-ch transistor is not directly connected to the positive power supply but connected to the source potential switching circuit 65. On the other hand, the pre-stage driver transistor circuit 61 also includes an inverter having a N-ch transistor and a P-ch transistor.

In the case in which the level of the node n61 during the standby period is "L", the P-ch transistor in the pre-stage driver transistor 61 turns on. At this time, the level of the node n60 turns "H" and the P-ch transistor in the main driver transistor circuit 6 turns off. In this case, therefore, the P-ch transistor in the main driver transistor circuit 6 corresponds to the object transistor 60 according to the present invention.

In the sixth preferred embodiment shown in FIG. 18, the source of only the object transistor 60 constituting the P-ch transistor adapted to turn off during the standby period is connected to the source potential switching circuit 65. This source potential switching circuit 65 functions as a switching element for changing the source potential of the P-ch transistor during the standby period, and supplies the voltage $V_{source}$ for changing the source potential of the object transistor 60 in such a manner that a positive bias voltage is applied between the gate and source of the P-ch transistor.

In other words, the source potential of the object transistor 60 during the standby period automatically becomes lower level ("L"), so that a positive bias voltage is applied between the gate and source of the object transistor 60. As a result, the sub-threshold current of the object transistor 60 constituting the P-ch transistor adapted to turn off during the standby period is remarkably reduced.

As shown in the sixth preferred embodiment described above, the source potential switching circuit for changing the source potential of the P-ch transistor adapted to turn off during the standby period of the driver transistor circuit produces a larger effect especially in the case in which the sub-threshold current is larger for the P-ch transistor in an off state than for the N-ch transistor in an off state.

In the sixth preferred embodiment, the timing of changing the source potential of the P-ch transistor (object transistor 60) adapted to turn off during the standby period of the driver transistor circuit is set in accordance with the potential change of the input signal (potential of the node n60) of the main driver transistor circuit but may alternatively be set in accordance with a predetermined program instruction.

Further, in the sixth preferred embodiment, one source potential switching circuit for changing the source potential of one of the P-ch transistors adapted to turn off during the standby period of the main driver transistor circuit is assigned to the particular P-ch transistor. In the case in which there are a plurality of P-ch transistors adapted to turn off during the standby period, however, it is also possible to assign one source potential switching circuit to a plurality of the P-ch transistors. This configuration in which one source potential switching circuit is assigned to a plurality of P-ch transistors is effective especially for simplifying the semiconductor integrated circuit according to the present invention.

Figure 19:
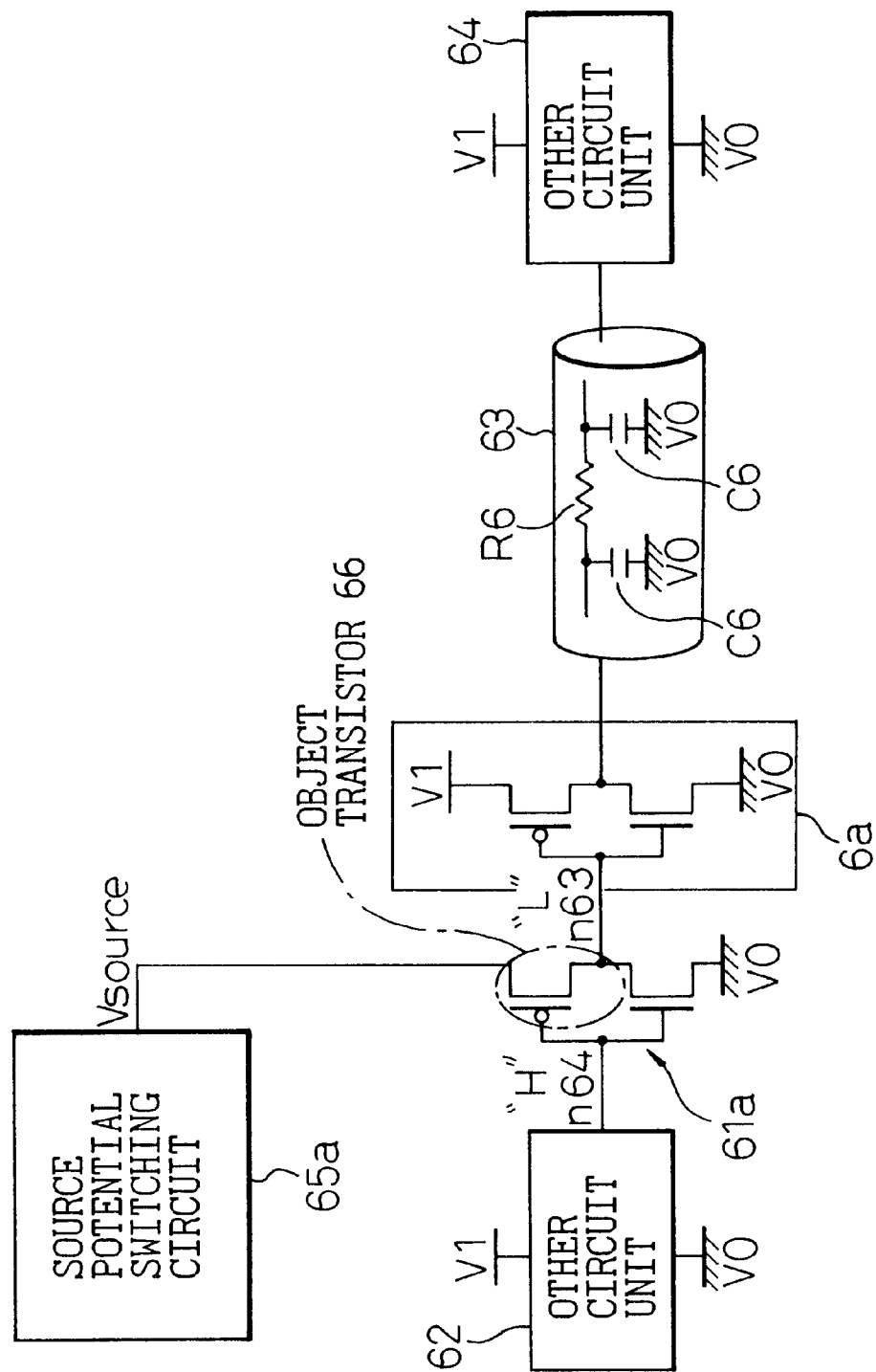
FIG. 19 is a circuit diagram showing a configuration of the modified example of FIG. 18.

FIG. 19 is a circuit diagram showing a configuration of the modified example of FIG. 18. This diagram also illustrates a configuration of the semiconductor integrated circuit including an object transistor according to the present invention which is adapted to turn off during the standby period in a driver transistor circuit including the main driver transistor circuit and the pre-stage driver transistor circuit located in the stage before the main driver transistor circuit. Further, in this case, too, the sub-threshold current is larger for the P-ch transistor in an off state than for the N-ch transistor in an off state.

In FIG. 19, as in FIG. 18, the main driver transistor circuit 6a includes an inverter having a N-ch transistor and a P-ch transistor for driving the wiring unit 63. Further, the pre-stage driver transistor circuit 61a located in the stage before the main driver transistor circuit 6a also includes an inverter having a N-ch transistor and a P-ch transistor.

Further, in FIG. 19, the level of the node n64 is "H" during the standby period, and therefore the P-ch transistor in the pre-stage driver transistor 61 turns off. At this time, the level of the node n63 turns "L" and the P-ch transistor in the main driver transistor circuit 6a turns on. In this case, therefore, the P-ch transistor in the pre-stage driver transistor circuit 61a corresponds to the object transistor 66 according to the present invention. The source of the N-ch transistor in the pre-stage driver transistor 61a is connected to the power supply of the ground potential V0, for example, and the drain thereof is connected to the drain of the P-ch transistor (object transistor 66). Further, the source of the P-ch transistor is connected not directly to the positive power supply but to the source potential switching circuit 65a.

In the modified example shown in FIG. 19, the source of only the object transistor 66 constituting the P-ch transistor adapted to turn off during the standby period is connected to the source potential switching circuit 65a. The source potential switching circuit 65a functions as a switching element for changing the source potential of the P-ch transistor during the standby period, and supplies the voltage $V_{source}$ for changing the source potential of the object transistor 66 in such a manner that a positive bias voltage is applied between the gate and source of the N-ch transistor.

In other words, the source potential of the object transistor 66 during the standby period turns "L" in level, so that a positive bias voltage is applied between the gate and the source of the transistor 66. In consequence, the sub-threshold current of the transistor 66 constituting the P-ch transistor adapted to turn off during the standby period is remarkably reduced.

Figure 20:
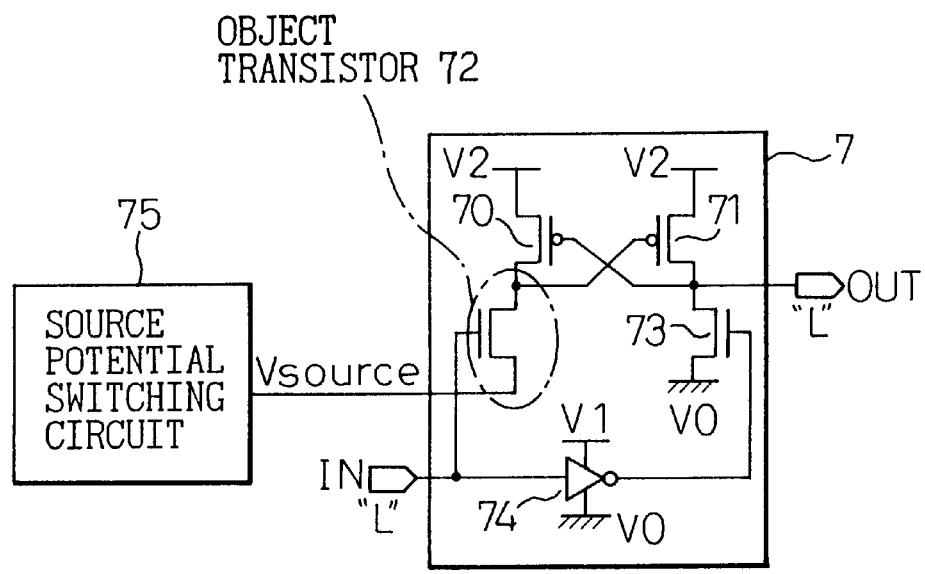
FIG. 20 is a circuit diagram showing a configuration of a seventh preferred embodiment of the present invention.

FIG. 20 is a circuit diagram showing a configuration according a seventh preferred embodiment of the present invention. This diagram illustrates a configuration of the semiconductor integrated circuit including an object transistor adapted to turn off during the standby period according to the present invention in a level converter (a level-up converter in this case) for changing the potential of the input signal to the potential V2 satisfying the relation V2>V1 where V1 is the potential of the power supply on high potential side of a normal circuit. Further, this diagram shows the case in which the sub-threshold current is larger for the N-ch transistor in an off state than for the P-ch transistor in an off state.

In FIG. 20, a circuit example is shown in which the level of the input signal IN turns "L" and the level of the output signal OUT also turns "L" during the standby period in which the level-up converter 7 is in a standby state, while during the activated period when the level-up converter 7 is activated, the level of the input signal turns "H" and so does the level of the output signal.

In the level-up converter 7 shown in FIG. 20, the gates and drains of the first P-ch transistor 70 and the second P-ch transistor 71 for producing an output signal OUT by changing the potential of the input signal IN upward are interconnected by cross coupling. Generally, with this level-up converter, it is necessary to secure a large gate width of the N-ch transistor as compared with the gate width of the P-ch transistor, to an increasing degree as the potential V1 of the power supply drops as compared with the potential V2. As a result, the source potential of the N-ch transistor adapted to turn off during the standby period is required to be adjusted appropriately.

Further, in the level-up converter shown in FIG. 20, the drain of the first N-ch transistor (i.e. the object transistor according to the present invention) 72 adapted to turn off during the standby period is connected to the gate of the second P-ch transistor 71. At the same time, the drain of the second N-ch transistor adapted to turn on during the standby period is connected to the gate of the first P-ch transistor 70. In this case, the input signal IN is input to the gate of the first N-ch transistor 72 and also, input to the second N-ch transistor 73 through the inverter 74. Also, the output signal OUT is output from the drain of the second P-ch transistor 71.

Further, in the level-up converter shown in FIG. 20, the source of the N-ch transistor 72 adapted to turn off during the standby period is connected not directly to the power supply of the ground potential V0 but connected to the source potential switching circuit 75. When an object circuit or an object circuit group in the semiconductor integrated circuit enters the standby state, the potential of the voltage $V_{source}$ supplied from the source potential switching circuit 75 changes so that a negative bias voltage is applied between the gate and source of the N-ch transistor according to the present invention. As a result, the sub-threshold current of the N-ch transistor 72 adapted to turn off during the standby period is remarkably reduced.

As shown in the seventh preferred embodiment described above, the circuit for changing the source potential of the N-ch transistor adapted to turn off during the standby period can produce a larger effect especially in the case in which a sub-threshold current is larger for the N-ch transistor in an off state than for the P-ch transistor in an off state.

In the seventh preferred embodiment described above, the timing of changing the source potential of the N-ch transistor adapted to turn off during the standby period of the level shifter circuit is set in accordance with the potential change of the input signal IN to the level shifter circuit but can alternatively be set in accordance with a predetermined program instruction.

Further, in the seventh preferred embodiment described above, one source potential switching circuit for changing the source potential of one of the N-ch transistors adapted to turn off during the standby period of the level shifter circuit is assigned to the particular N-ch transistor. In the case in which there are a plurality of N-ch transistors adapted to turn off during the standby period, however, it is possible to assign one source potential switching circuit to a plurality of these N-ch transistors. This configuration of assigning one source potential switching circuit to a plurality of N-ch transistors in this way is effective especially for simplifying the semiconductor integrated circuit according to the present invention.

Figure 21:
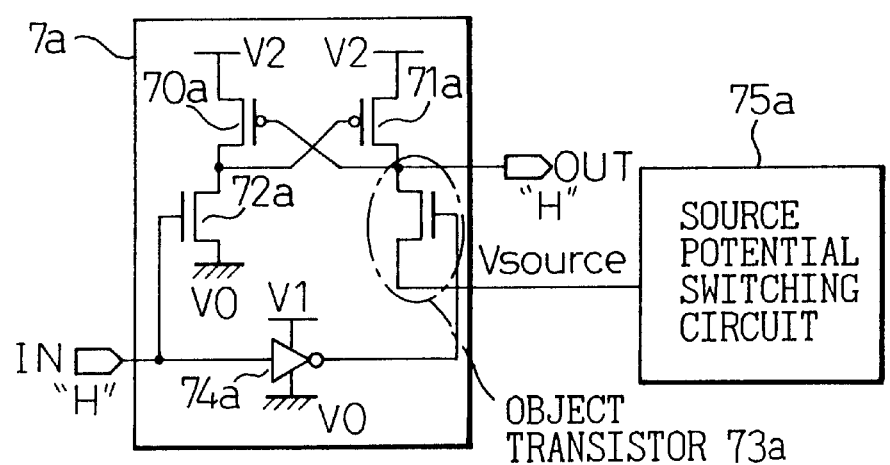
FIG. 21 is a circuit diagram showing a configuration of the modified example of FIG. 20.

FIG. 21 is a circuit diagram showing a configuration of the modified example of FIG. 20. This diagram also illustrates a configuration of the semiconductor integrated circuit including an object transistor according to the present invention which is adapted to turn off during the standby period in the level-up converter 7a. Further, the diagram shows the case in which the sub-threshold current is larger for the N-ch transistor in an off state than for the P-ch transistor in an off state.

In FIG. 21, a circuit example is shown in which during the standby period of the level-up converter 7a, the level of the input signal IN turns "H", and so does the level of the output signal OUT, while during the activated period of the level-up converter, the level of the input signal turns "L" and so does the level of the output signal.

In the level-up converter 7a shown in FIG. 21, only the N-ch transistor (i.e., the object transistor according to the invention) 73a adapted to turn off during the standby period is different from the level-up converter of FIG. 20 described above, and the circuit configuration substantially remains the same as the configuration of the circuit shown in FIG. 20. More specifically, in the level-up converter of FIG. 21, the gates and drains of the first P-ch transistor 70a and the second P-ch transistor 71a for producing an output signal OUT by changing the potential of the input signal IN upward are interconnected by cross coupling.

Further, in the level-up converter of FIG. 21, the drain of the first N-ch transistor 72a adapted to turn on during the standby period is connected to the gate of the second P-ch transistor 71a, and the drain of the second N-ch transistor 73a (the object transistor) adapted to turn off during the standby period is connected to the gate of the first P-ch transistor 73a. In this case, the input signal IN is input to the gate of the first N-ch transistor 72a and also, input to the gate of the second N-ch transistor 73a through the inverter 74a. On the other hand, the output signal OUT is output from the drain of the second P-ch transistor 71a.

Also in the modified example shown in FIG. 21, the source of the N-ch transistor 73a adapted to turn off during the standby period is connected to the source potential switching circuit without being directly connected to the power supply of the ground potential V0. When the object circuit or the object circuit group in the semiconductor integrated circuit enters the standby state, the potential of the voltage $V_{source}$ supplied from the source potential switching circuit 75a undergoes a change, so that a negative bias voltage is imposed between the gate and source of the N-ch transistor 73a according to the present invention. As a result, the sub-threshold current of the N-ch transistor 73a adapted to turn off during the standby period is remarkably reduced.

Figure 22:
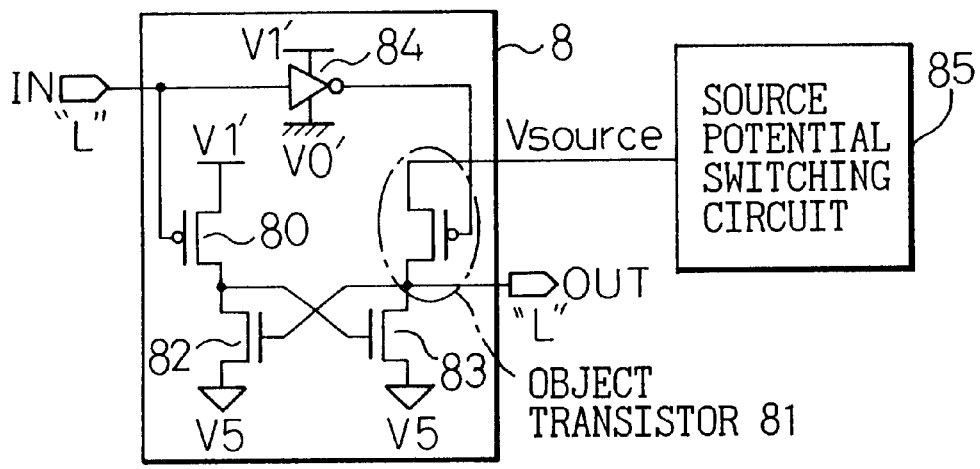
FIG. 22 is a circuit diagram showing a configuration of an eighth preferred embodiment of the present invention.

FIG. 22 is a circuit diagram showing a configuration of an eighth preferred embodiment of the present invention. This diagram illustrates a configuration of a semiconductor integrated circuit including an object transistor according to the present invention adapted to turn off during the standby period in a level converter (a level-down converter in the case under consideration) for changing the potential of the input signal to the potential V5 satisfying the relation V5<V0 of the power supply (such as the ground potential V0') on the low potential side of an ordinary circuit. Further, this diagram shows an example in which the sub-threshold current is larger for the P-ch transistor in an off state than for the N-ch transistor in an off state.

FIG. 22 shows a circuit example in which, during the standby period when the level-down converter 8 is in standby state, the level of the input signal IN turns "L" and so does the output signal OUT, while during the activated period when the level-down converter 8 is activated, the level of the input signal turns "H" and so does the level of the output signal.

In the level-down converter 8 shown in FIG. 22, the gates and the drains of the first N-ch transistor 82 and the second N-ch transistor 83 for producing the output signal OUT by changing the potential of the input signal IN downward are interconnected by cross coupling. Generally, in this level-down converter, the larger the potential |V1'−V5| (indicated by the absolute value) relative to the potential of the power supply |V1'−V0'| (indicated by the absolute value), the larger gate width of the P-ch transistor is required as compared with the gate width of the N-ch transistor. As a result, the source potential of the P-ch transistor adapted to turn off during the standby period is required to be tactfully changed.

Further, in the level-down converter of FIG. 22, the drain of the second P-ch transistor (i.e. the object transistor according to the present invention) 81 adapted to turn off during the standby period is connected to the gate of the first N-ch transistor 82 on the one hand, and the drain of the first P-ch transistor 80 adapted to turn on during the standby period is connected to the gate of the second N-ch transistor 83 on the other hand. In this case, the input signal IN is input to the gate of the first P-ch transistor 80 and also, input to the gate of the second P-ch transistor 81 through the inverter 84. On the other hand, the output signal OUT is output from the drain of the second N-ch transistor 83.

Further, in the level-down converter of FIG. 22, the source of the P-ch transistor 81 adapted to turn off during the standby period is connected to the source potential switching circuit 85 without being directly connected to the power supply on high potential side (such as the potential V1'). In contrast, the source of the P-ch transistor 80 adapted to turn on during the standby period is connected to the power supply on high potential side as in the normal case. When the object circuit or the object circuit group in the semiconductor integrated circuit enters the standby state, the potential of the voltage $V_{source}$ supplied from the source potential switching circuit 85 undergoes a change so that a positive bias voltage is applied between the gate and source of the P-ch transistor 81 according to the invention. As a result, the sub-threshold current of the P-ch transistor 81 adapted to turn off during the standby period is remarkably reduced.

As is obvious from the eighth preferred embodiment described above, the circuit for changing the source potential of the P-ch transistor adapted to turn off during the standby period produces a larger effect especially in the case in which the sub-threshold current is larger for the P-ch transistor in an off state than for the N-ch transistor in an off state.

In the eighth preferred embodiment described above, the timing of changing the source potential of the P-ch transistor adapted to turn off during the standby period of the level-down converter is set in accordance with the potential change of the input signal IN of the level-down converter, but can alternatively be set in accordance with a predetermined program instruction.

Further, in the eighth preferred embodiment described above, one source potential switching circuit for changing the source potential of one of the P-ch transistors adapted to turn off during the standby period of the level-down converter is assigned to the particular P-ch transistor. In the case in which there are a plurality of P-ch transistors adapted to turn off during the standby period, however, it is also possible to assign one source potential switching circuit to a plurality of these P-ch transistors. The configuration of assigning one source potential switching circuit to a plurality of P-ch transistors in this way is effective especially for simplifying the semiconductor integrated circuit according to the present invention.

Figure 23:
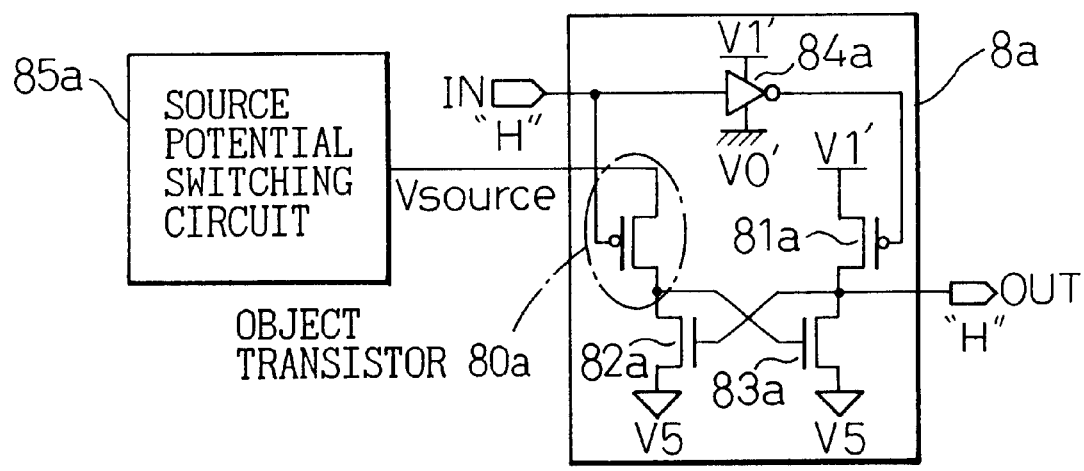
FIG. 23 is a circuit diagram showing a configuration of the modified example of FIG. 22.

FIG. 23 is a circuit diagram showing a configuration of the modified example of FIG. 22. This diagram also illustrates a configuration of the semiconductor integrated circuit including an object transistor according to the present invention adapted to turn off during the standby period in the level-down converter 8a. Further, this diagram illustrates the case in which the sub-threshold current is larger for the P-ch transistor in an off state than for the N-ch transistor in an off state.

FIG. 23 shows a circuit example in which during the standby period of the level-down converter 8a, the level of the input signal IN turns "H" and so does the level of the output signal OUT while during the activated period of the level-down converter, the level of the input signal turns "L" and so does the level of the output signal.

In the level-down converter 8a shown in FIG. 23, only the P-ch transistor (i.e., the object transistor according to the present invention) 80a adapted to turn off during the standby period is different from the level-down converter of FIG. 22 described above, and the circuit configuration is substantially the same as that of the circuit shown in FIG. 22. More specifically, in the level-down converter of FIG. 23, the gates and the drains of the first N-ch transistor 82a and the second N-ch transistor 83a for producing an output signal OUT by changing the potential of the input signal IN downward are interconnected by cross coupling.

Further, in the level-down converter of FIG. 23, the drain of the first P-ch transistor 80a (the object transistor) adapted to turn off during the standby period is connected to the gate of the second N-ch transistor 83a on the one hand, and the drain of the second P-ch transistor 81a adapted to turn on during the standby period is connected to the gate of the first N-ch transistor 82a on the other hand. In this case, the input signal IN is input to the gate of the first P-ch transistor 80a and also, input to the gate of the second P-ch transistor 81a through the inverter 84a. On the other hand, the output signal OUT is output from the drain of the second N-ch transistor 83a.

Also in the modified example shown in FIG. 23, the source of the P-ch transistor 80a adapted to turn off during the standby period is connected to the source potential switching circuit 85a without being directly connected to the power supply on high potential side. When the object circuit or the object circuit group in the semiconductor integrated circuit becomes the standby state, the potential of the voltage $V_{source}$ supplied from the source potential switching circuit 85a undergoes a change so that a positive bias voltage is applied between the gate and source of the P-ch transistor 80a according to the present invention. As a result, the sub-threshold current of the P-ch transistor 80a adapted to turn off during the standby period is remarkably reduced.

Figure 24:
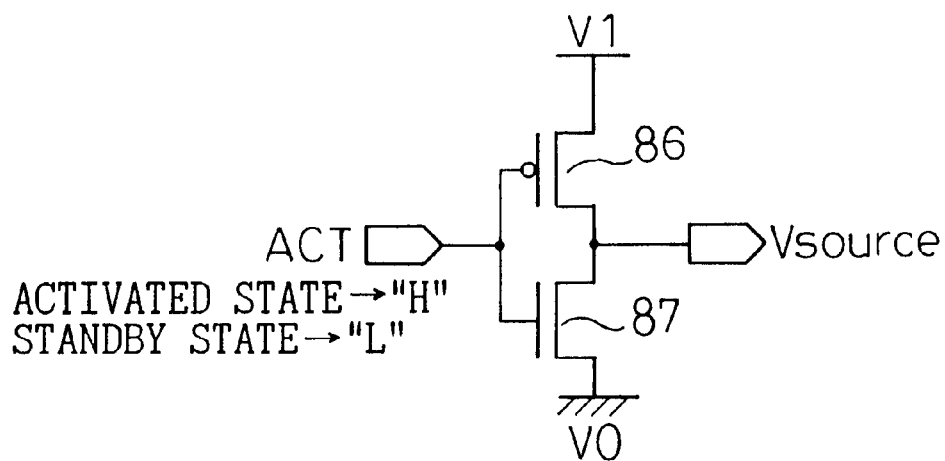
FIG. 24 is a circuit diagram showing a configuration of a first example of a source potential switching circuit used in an embodiment of the present invention.
Figure 25:
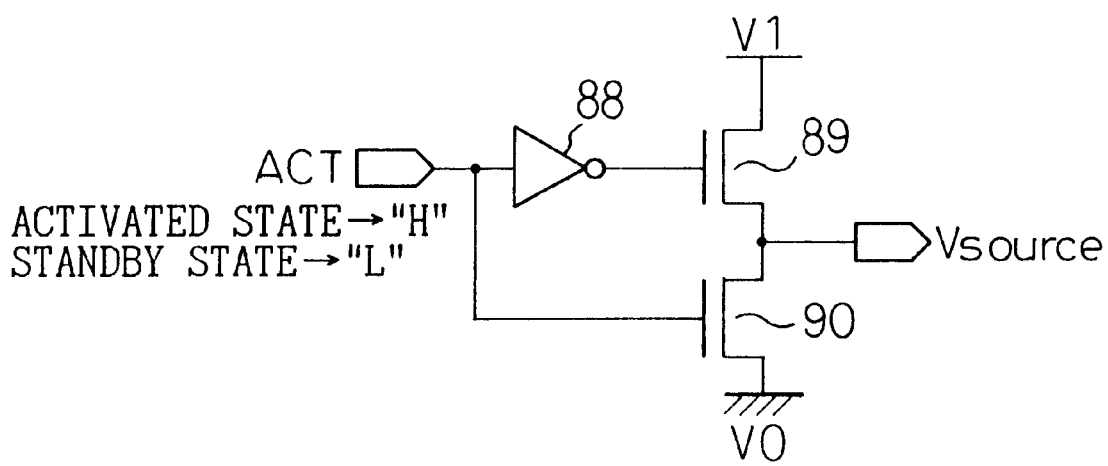
FIG. 25 is a circuit diagram showing a configuration of a second example of a source potential switching circuit used in an embodiment of the present invention.

FIG. 24 is a circuit diagram showing a configuration of a first example of a source potential switching circuit used in an embodiment of the present invention, and FIG. 25 is a circuit diagram showing a configuration of a second example of a source potential switching circuit used in an embodiment of the present invention.

In the source potential switching circuits of FIGS. 24 and 25, an example is shown in which the potential of the voltage $V_{source}$ turns "L" during the activated period of the object circuit in the semiconductor integrated circuit, while the potential of the voltage $V_{source}$ turns "H" during the standby period. In the case in which the potential of the node ACT turns "L" during the activated period and turns "H" during the standby period, however, the operation of the source potential switching circuit can be regarded to operate similarly by reversing the logic. The source potential switching circuits of FIGS. 24 and 25 represent an example of a switch circuit for switching the source potential of the N-ch transistor.

The source potential switching circuit shown in FIG. 24 includes an inverter having a P-ch transistor 86 and a N-ch transistor 87. More specifically, the source potential switching circuit described above includes a P-ch transistor having the drain thereof connected to the drain of the N-ch transistor 87, and the source of the P-ch transistor 86 is connected to the power supply of the positive potential V1 for applying a negative bias voltage between the gate and source of the N-ch transistor according to the present invention during the standby period. The source potential switching circuit having this configuration has the function of increasing the source potential of the N-ch transistor (the object transistor according to the present invention) which is equal to the ground potential during the activated period, up to a positive potential V1 during the standby period. The timing of changing the source potential of the N-ch transistor according to the present invention by the source potential switching circuit is set in accordance with the potential change of the input signal to the driver transistor circuit or the level converter or in accordance with a predetermined program instruction.

On the other hand, the source potential switching circuit shown in FIG. 25 includes two N-ch transistors 89, 90 and one inverter 88. More specifically, the source potential switching circuit includes the second N-ch transistor 89 having a source connected to the drain of the first N-ch transistor 90, and the drain of this N-ch transistor 89 is connected to the power supply of the positive potential V1 for applying a negative bias voltage between the gate and source of the N-ch transistor according to the present invention. In the source potential switching circuit having this configuration, the threshold voltage Vth between the gate and source of the N-ch transistor 89 cannot be neglected. The source potential of the N-ch transistor that remains at the ground potential during the activated period, therefore, rises to a potential level lower than the positive potential V1 by the threshold voltage Vth during the standby period. As described with reference to the graph of FIG. 1, even when only a small amount of bias voltage is applied between the gate and source, the sub-threshold current is reduced to such an extent that the potential obtained from the source potential switching circuit during the standby period is sufficient.

Figure 26:
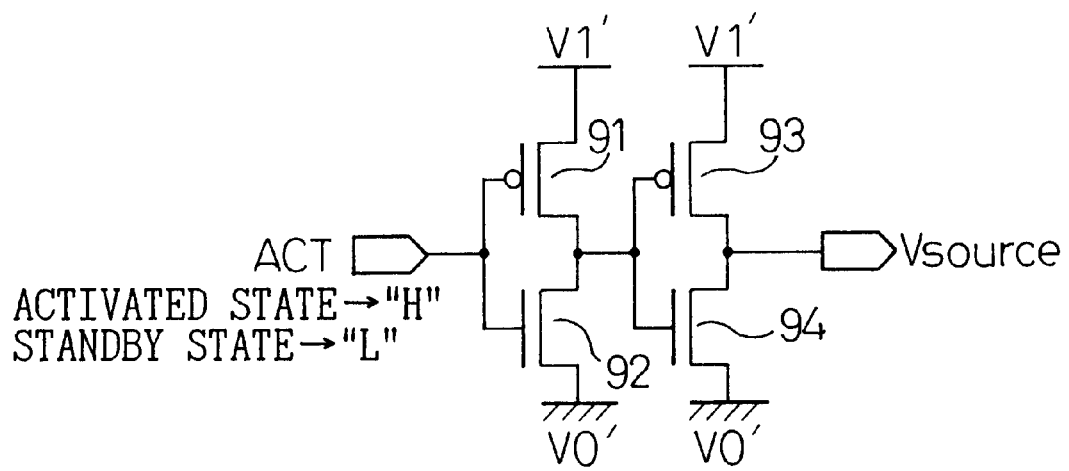
FIG. 26 is a circuit diagram showing a configuration of a third example of a source potential switching circuit used in an embodiment of the present invention.
Figure 27:
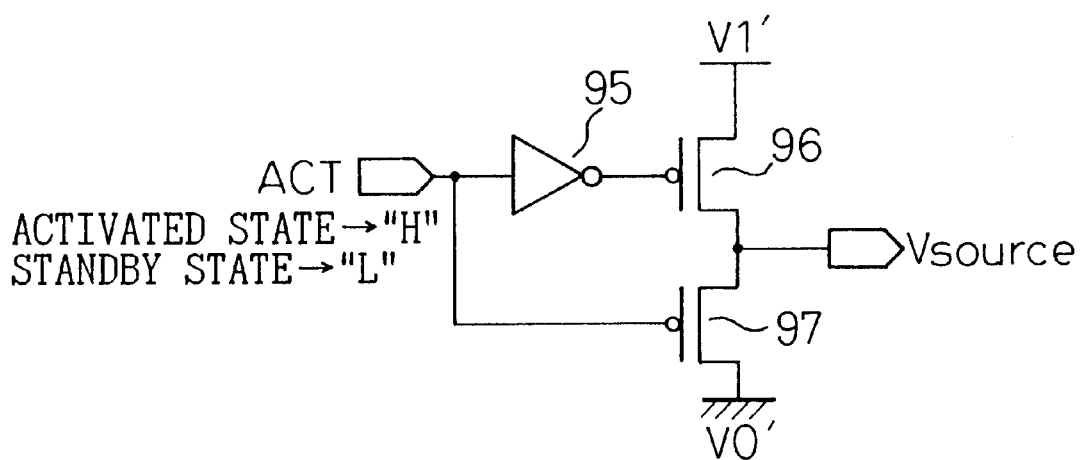
FIG. 27 is a circuit diagram showing a configuration of a fourth example of a source potential switching circuit used in an embodiment of the present invention.

FIG. 26 is a circuit diagram showing a configuration of a third example of the source potential switching circuit used in an embodiment of the present invention, and FIG. 27 is a circuit diagram showing a configuration of a fourth example of the source potential switching circuit used in an embodiment of the present invention.

Also in the source potential switching circuits of FIGS. 26 and 27, an example is shown in which the potential of the voltage $V_{source}$ turns "H" during the activated period of the object circuit according to the present invention of the semiconductor integrated circuit and the potential of the voltage $V_{source}$ turns "L" during the standby period. In the case in which the node ACT turns "L" during the activated period and turns "H" during the standby period, however, the operation of the source potential switching circuit can be regarded similarly by reversing the logic. Further, the source potential switching circuits of FIGS. 26 and 27 represent an example of a switch circuit for switching the source potential of the P-ch transistor.

The source potential switching circuit shown in FIG. 26 includes a first-stage inverter having a P-ch transistor 91 and a N-ch transistor 92 and a second-stage inverter having a P-ch transistor 93 and a N-ch transistor 94. The first-stage inverter is provided for inverting the level of the signal input to the source potential switching circuit and not directly related to the present invention.

More specifically, the source potential switching circuit described above includes a N-ch transistor 94 having the drain thereof connected to the drain of the P-ch transistor 93, and the source of the N-ch transistor 94 is connected to the power supply (such as the ground potential V0') on the low potential side for applying a positive bias voltage between the gate and source of the P-ch transistor according to the present invention during the standby period. The source potential switching circuit of this configuration has the function of reducing the source potential of the P-ch transistor (the object transistor according to the present invention) which remains high during the activated period, down to the ground potential V0'. The timing of changing the source potential of the N-ch transistor according to the present invention by the source potential switching circuit is set in accordance with the potential change of the input signal to the driver transistor circuit or the level converter or in accordance with a predetermined program instruction.

On the other hand, the source potential switching circuit shown in FIG. 27 includes two P-ch transistors 96, 97 and one inverter 95. More specifically, the source potential switching circuit described above includes the second P-ch transistor 97 having the source thereof connected to the drain of the first P-ch transistor 96, and the drain of this P-ch transistor 97 is connected to the power supply (such as the ground potential V0') on the low potential side for applying a positive bias voltage between the gate and source of the N-ch transistor according to the present invention. In the source potential switching circuit of this configuration, the threshold voltage Vth between the gate and source of the P-ch transistor 97 cannot be neglected, and therefore the source potential of the P-ch transistor (the object transistor according to the present invention) which is high during the activated period decreases to a potential level higher than the ground potential V0' by the threshold voltage Vth during the standby period. As explained with reference to the graph of FIG. 1, even when only a small amount of bias voltage is applied between the gate and source, the sub-threshold current is considerably reduced, and therefore the potential obtained from the source potential switching circuit during the standby period is sufficient.

For each of the source potential switching circuit of FIGS. 24 to 27, one source potential switching circuit or one power switching circuit are arranged for one driver transistor circuit or one level converter. As an alternative, one power switching circuit can be arranged for a plurality of driver transistor circuits or level converters. In such a case, the operation is similar to the one shown in FIGS. 24 to 27.

As described above, first, according to some typical embodiments of the present invention, there is provided a semiconductor integrated circuit in which, in a circuit unit including a plurality of transistors having a predetermined function, the source potential of one of the transistors adapted to turn off during the standby period is changed so that the sub-threshold current of the particular transistor can be remarkably reduced, and therefore lower power consumption during the standby state of the semiconductor integrated circuit, in which the higher integration is always advanced while the size and the voltage always continue to decrease, can be realized while, at the same time, promoting an application to a semiconductor integrated circuit having low power consumption.

Second, according to some typical embodiments of the present invention, there is provided a semiconductor integrated circuit in which, among the N-ch transistors and the P-ch transistors adapted to turn off during the standby period of a level shifter circuit for changing the potential of the input signal, the source potential of only the transistor with the sub-threshold current larger in an off state is changed so that the sub-threshold current of the particular transistor is remarkably reduced, thus making it possible to realize lower power consumption during the standby period with a simple circuit configuration.

Third, according to some typical embodiments of the present invention, there is provided a semiconductor integrated circuit in which the timing of changing the source potential of a transistor adapted to turn off during the standby period of the level shifter circuit is set easily in accordance with the potential change of the input signal or in accordance with a program instruction, and therefore the control system for controlling the timing is not complicated.

Fourth, according to some typical embodiments of the present invention, there is provided a semiconductor integrated circuit in which one switching element for changing the source potential of one transistor adapted to turn off during the standby period of the level shifter circuit is assigned to the particular transistor, and therefore the switching of the source potential by the switching element can be easily and rapidly controlled.

Fifth, according to some typical embodiments of the present invention, there is provided a semiconductor integrated circuit in which the switching element for changing the source potential of the transistor adapted to turn off during the standby period of the level shifter circuit can minimize the leakage current during the standby period since a bias voltage is applied between the gate and source in such a direction as to reduce the sub-threshold current of the particular transistor.

Sixth, according to some typical embodiments of the present invention, there is provided a semiconductor integrated circuit in which one switching element for changing the source potential of a plurality of transistors adapted to turn off during the standby period of the level shifter circuit is assigned to the particular transistors and, therefore, an extraneous switching element is eliminated for promoting a higher integration.

Seventh, according to some typical embodiments of the present invention, there is provided a semiconductor integrated circuit in which among the N-ch transistors and P-ch transistors adapted to turn off during the standby period of the driver transistor circuit requiring a transistor of the large gate width, the source potential of only the transistor having a large sub-threshold current in an off state is changed to reduce the sub-threshold current of the particular transistor remarkably, and therefore lower power consumption can be realized and the voltage is reduced during the standby period with a simple circuit configuration.

Eighth, according to some typical embodiments of the present invention, there is provided a semiconductor integrated circuit in which the timing of changing the source potential of the transistor adapted to turn off during the standby period of the driver transistor circuit can be easily set in accordance with the potential change of the input signal or in accordance with a program instruction and, therefore, the control system for controlling the timing is not complicated.

Ninth, according to some typical embodiments of the present invention, there is provided a semiconductor integrated circuit in which one source potential switching circuit for changing the source potential of one transistor adapted to turn off during the standby period of the driver transistor circuit is assigned to the particular transistor and, therefore, the switching of the source potential can be controlled easily and rapidly while at the same time minimizing the load on the source potential switching circuit.

Tenth, according to some typical embodiments of the present invention, there is provided a semiconductor integrated circuit in which the source potential switching circuit for changing the source potential of the transistor adapted to turn off during the standby period of the driver transistor circuit is such that a bias voltage is applied between the gate and source in a direction to reduce the sub-threshold current of the transistor and, therefore, the leakage current during the standby period can be minimized.

Eleventh, according to some typical embodiments of the present invention, there is provided a semiconductor integrated circuit in which one source potential switching circuit for changing the source potential of a plurality of transistors adapted to turn off during the standby period of the driver transistor circuit is assigned to the particular transistors and, therefore, the size of the source potential switching circuit can be reduced while at the same time promoting a higher integration.

What is claimed is:

1. A semiconductor integrated circuit comprising a circuit unit having a predetermined function formed of a plurality of transistors,
    wherein the source potential of at least one of a plurality of transistors which turns off during the standby period of said circuit unit is changed in a manner such that a negative bias voltage is applied between the gate and the source of said transistor, and
    wherein the source potential of at least one of a plurality of transistors which turns on during the standby period is not changed substantially.

2. A semiconductor integrated circuit comprising a circuit unit having a predetermined function formed of a plurality of transistors,
    wherein the source potential of at least one of a plurality of transistors which turns off during the standby period of said circuit unit is changed in a manner such that a negative bias voltage is applied between the gate and the source of said transistor,
    wherein the sub-threshold current flowing between the source and the drain of at least one transistor adapted to turn off during the standby period of said circuit unit is reduced, and
    wherein the source potential of at least one of a plurality of transistors which turns on during the standby period is not changed substantially.

3. The semiconductor integrated circuit according to claim 1, wherein said circuit unit is a level shifter circuit including a plurality of transistors for changing the potential of an input signal upward or downward.

4. The semiconductor integrated circuit according to claim 3, wherein said circuit unit is a level shifter circuit including a plurality of transistors for changing the potential of the input signal upward or downward.

5. The semiconductor integrated circuit according to claim 3, wherein the timing of changing the source potential of the transistor adapted to turn off during the standby period of said level shifter circuit is set in accordance with the potential change of said input signal to said level shifter circuit or in accordance with a predetermined program instruction.

6. The semiconductor integrated circuit according to claim 3, wherein a switching element for changing the source potential of one or a plurality of transistors adapted to turn off during the standby period of said level shifter circuit is assigned to said transistor, and wherein said switching element changes the source potential of said transistor in such a manner that a predetermined bias voltage is applied between the gate and the source of said transistor during the standby period of said level shifter.

7. A semiconductor integrated circuit comprising a circuit unit having a predetermined function formed of a plurality of transistors, wherein the source potential of at least one of a plurality of transistors which turns off during the standby period of said circuit unit is changed in a manner such that a minus bias voltage is applied between the gate and the source of said transistor, wherein said circuit unit is a level shifter circuit including a plurality of transistors for changing the potential of an input signal upward or downward, wherein said level shifter circuit includes at least a transistor of a first conduction type and at least a transistor of a second conduction type for changing the potential of said input signal, a switching element for changing the source potential of said transistor of a first conduction type is assigned to one or a plurality of transistors of a first conduction type adapted to turn off during the standby period of said level shifter circuit, said switching element includes a transistor of a second conduction type having a drain connected to the source of said transistor of a first conduction type, the source of said transistor of a second conduction type is connected to a power supply for applying a predetermined bias voltage between the gate and the source of said transistor of a first conduction type, a signal for turning on said transistor of a second conduction type during the standby period of said level shifter circuit is supplied to the gate of said transistor of a second conduction type, and the source potential of said transistor of a first conduction type is kept substantially at a potential equal to the power supply during the standby period of said level shifter circuit, and wherein the source potential of at least one of a plurality of transistors which turns on during the standby period is not changed substantially.

8. The semiconductor integrated circuit according to claim 7, wherein said level shifter circuit includes at least a transistor of a first conduction type and at least a transistor of a second conduction type for changing the potential of said input signal;

wherein, in the case in which the sub-threshold current with said transistor of a first conduction type in an off state is larger than the sub-threshold current with said transistor of a second conduction type in an off state, the source potential of said transistor of a first conduction type adapted to turn off during the standby period of said level shifter circuit is changed at a timing based on said standby period.

9. A semiconductor integrated circuit comprising a circuit unit having a predetermined function formed of a plurality of transistors, wherein the source potential of at least one of a plurality of transistors which turns off during the standby period of said circuit unit is changed in a manner such that a minus bias voltage is applied between the gate and the source of said transistor, wherein said circuit unit is a level shifter circuit including a plurality of transistors for changing the potential of an input signal upward or downward, wherein said level shifter circuit includes at least a transistor of a first conduction type and at least a transistor of a second conduction type for changing the potential of said input signal, a switching element for changing the source potential of one or a plurality of transistors of a first conduction type adapted to turn off during the standby period of said level shifter circuit is assigned to said transistor of a second conduction type, said switching element includes a transistor of a first conduction type having a drain connected to the source of said transistor of a second conduction type, the source of said transistor of a first conduction type is connected to a power supply for applying a predetermined bias voltage between the gate and the source of said transistor of a first conduction type, a signal for turning on said transistor of a first conduction type during the standby period of said level shifter circuit is supplied to the gate of said transistor of a first conduction type, and the source potential of said transistor of a second conduction type is kept substantially at a potential equal to the power supply during the standby period of said level shifter circuit, and wherein the source potential of at least one of a plurality of transistors which turns on during the standby period is not changed substantially.

10. The semiconductor integrated circuit according to claim 9, wherein said level shifter circuit includes at least a transistor of a first conduction type and at least a transistor of a second conduction type for changing the potential of said input signal;

wherein, in the case in which the sub-threshold current with said transistor of second conduction type in an off state is larger than the sub-threshold current with said transistor of a first conduction type in an off state, the source potential of said transistor of a second conduction type adapted to turn off during the standby period of said level shifter circuit is changed at a timing based on said standby period.

11. A semiconductor integrated circuit comprising a circuit unit having a predetermined function formed of a plurality of transistors, wherein the source potential of at least one of a plurality of transistors which turns off during the standby period of said circuit unit is changed in a manner such that a minus bias voltage is applied between the gate and the source of said transistor, wherein said semiconductor integrated circuit further comprises a source potential switching circuit for changing the source potential of said at least one of a plurality of said transistors which is adapted to turn off during the standby period of said circuit unit, and wherein the source potential of at least one of a plurality of transistors which turns on during the standby period is not changed substantially.

12. The semiconductor integrated circuit according to claim 2, comprising a source potential of at least one of a plurality of said transistors which is adapted to turn off during the standby period of said circuit unit.

13. The semiconductor integrated circuit according to claim 11, wherein said source potential switching circuit changes the source potential of at least a transistor adapted to turn off during the standby period of said circuit unit in such a manner that a predetermined bias voltage is applied between the gate and the source of said transistor at a timing based on the standby period of said circuit unit.

14. The semiconductor integrated circuit according to claim 11, wherein the sub-threshold current flowing between the source and the drain of at least a transistor adapted to turn off during the standby period of said circuit unit is reduced.

15. The semiconductor integrated circuit according to claim 11, wherein said circuit unit is a level shifter circuit including a plurality of transistors for changing the potential of said input signal upward or downward.

16. The semiconductor integrated circuit according to claim 13, wherein said circuit unit is a level shifter circuit including a plurality of transistors for changing the potential of said input signal upward or downward.

17. The semiconductor integrated circuit according to claim 15, wherein the timing of changing the source potential of a transistor adapted to turn off during the standby period of said level shifter circuit is set in accordance with the potential change of said input signal to said level shifter circuit or in accordance with a predetermined program instruction.

18. The semiconductor integrated circuit according to claim 15, wherein said level shifter circuit includes at least a transistor of a first conduction type and at least a transistor of a second conduction type for changing the potential of said input signal;

wherein, in the case in which the sub-threshold current with said transistor of a first conduction type in an off state is larger than the sub-threshold current with said transistor of a second conduction type in an off state, the source potential of said transistor of a first conduction type adapted to turn off during the standby period of said level shifter circuit is changed at a timing based on said standby period.

19. The semiconductor integrated circuit according to claim 15, wherein said level shifter circuit includes at least a transistor of a first conduction type and at least a transistor of a second conduction type for changing the potential of said input signal;

wherein, in the case in which the sub-threshold current with said transistor of a second conduction type in an off state is larger than the sub-threshold current with said transistor of a first conduction type in an off state, the source potential of said transistor of a second conduction type adapted to turn off during the standby period of said level shifter circuit is changed at a timing based on said standby period.

20. The semiconductor integrated circuit according to claim 11, wherein said circuit unit is at lest a selected one of a main driver transistor circuit having a plurality of transistors for driving a wiring unit in said semiconductor integrated circuit and a pre-stage driver transistor circuit located in the stage before said main driver transistor circuit.

21. The semiconductor integrated circuit according to claim 20, wherein the timing of changing the source potential of a transistor adapted to turn off during the standby period of said driver transistor circuit is set in accordance with the potential change of said input signal of said circuit unit or in accordance with a predetermined program instruction.

22. The semiconductor integrated circuit according to claim 20, wherein said source potential switching circuit for changing the source potential of one of a plurality of transistors which is adapted to turn off during the standby period of said circuit unit is assigned to said transistor;

wherein said source potential switching circuit changes the source potential of said transistor in a manner such that a predetermined bias voltage is applied between the gate and the source of said transistor during the standby period of said circuit unit.

23. The semiconductor integrated circuit according to claim 15, wherein said circuit unit includes at least a transistor of a first conduction type and at least a transistor of a second conduction type, said source potential switching circuit for changing the source potential of one or a plurality of transistors of a first conduction type adapted to turn off during the standby period of said level shifter circuit is assigned to said transistor of a first conduction type, said source potential switching circuit includes a transistor of a second conduction type having a drain connected to the source of said transistor of a first conduction type, the source of said transistor of a second conduction type is connected to a power supply for applying a predetermined bias voltage between the gate and the source of said transistor of a first conduction type, a signal for turning on said transistor of a second conduction type during the standby period of said circuit unit is supplied to the gate of said transistor of a second conduction type, and the source potential of said transistor of a first conduction type is kept substantially at a potential equal to the power supply during the standby period of said circuit unit.

24. The semiconductor integrated circuit according to claim 15, wherein said circuit unit includes at least a transistor of a first conduction type and at least a transistor of a second conduction type, said source potential switching circuit for changing the source potential of one or a plurality of transistors of a first conduction type adapted to turn off during the standby period of said level shifter circuit is assigned to said transistor of a first conduction type, said source potential switching circuit includes a second transistor of a first conduction type having a source connected to the source of said transistor of a first conduction type, the drain of said second transistor of a first conduction type is connected to a power supply for applying a predetermined bias voltage between the gate and the source of said transistor of a first conduction type, a signal for turning on said second transistor of a first conduction type during the standby period of said circuit unit is supplied to the gate of said second transistor of a first conduction type, and the source potential of said transistor of a first conduction type is kept substantially at a potential equal to the power supply during the standby period of said circuit unit.

25. The semiconductor integrated circuit according to claim 20, wherein said circuit unit includes at least a transistor of a first conduction type and at least a transistor of a second conduction type, said source potential switching circuit for changing the source potential of one or a plurality of transistors of a second conduction type adapted to turn off during the standby period of said circuit unit is assigned to said transistor of a second conduction type, said source potential switching circuit includes a transistor of a first conduction type having a drain connected to the source of said transistor of said second conduction type, the source of said transistor of a first conduction type is connected to a power supply for applying a predetermined bias voltage between the gate and the source of said transistor of a second conduction type, a signal for turning on said transistor of a first conduction type during the standby period of said circuit unit is supplied to the gate of said transistor of a first conduction type, and the source potential of said transistor of a second conduction type is kept substantially at a potential equal to the power supply during the standby period of said circuit unit.

26. The semiconductor integrated circuit according to claim 20, wherein said circuit unit includes at least a transistor of a first conduction type and at least a transistor of a second conduction type, said source potential switching circuit for changing the source potential of one or a plurality of transistors of a second conduction type adapted to turn off during the standby period of said circuit unit is assigned to said transistor of a second conduction type, said source potential switching circuit includes a second transistor of a second conduction type having a source connected to the source of said transistor of a second conduction type, the drain of said second transistor of a second conduction type is connected to a power supply for applying a predetermined bias voltage between the gate and the source of said transistor of a second conduction type, a signal for turning on said second transistor of a second conduction type during the standby period of said circuit unit is supplied to the gate of said second transistor of a second conduction type, and the source potential of said transistor of a second conduction type is kept substantially at a potential equal to the power supply during the standby period of said circuit unit.

27. The semiconductor integrated circuit according to claim 23, wherein said circuit unit includes at least a transistor of a first conduction type and at least a transistor of a second conduction type, and
wherein, in the case in which the sub-threshold current with said transistor of a first conduction type in an off state is larger than the sub-threshold current with said transistor of a second conduction type in an off state, the source potential of said transistor of a first conduction type adapted to turn off during the standby period of said circuit unit is changed at a timing based on said standby period.

28. The semiconductor integrated circuit according to claim 24, wherein said circuit unit includes at least one transistor of a first conduction type and at least one transistor of a second conduction type, and
wherein, in the case in which the sub-threshold current with said transistor of a first conduction type in an off state is larger than the sub-threshold current with said transistor of a second conduction type in an off state, the source potential of said transistor of a first conduction type adapted to turn off during the standby period of said circuit unit is changed at a timing based on said standby period.

29. The semiconductor integrated circuit according to claim 25, wherein said circuit unit includes at least a transistor of a first conduction type and at least a transistor of a second conduction type, and
wherein, in the case in which the sub-threshold current with said transistor of a second conduction type in an off state is larger than the sub-threshold current with said transistor of a first conduction type in an off state, the source potential of said transistor of a second conduction type adapted to turned off during the standby period of said driver transistor circuit is changed at a timing based on said standby period.

30. The semiconductor integrated circuit according to claim 26, wherein said circuit unit includes at least a transistor of a first conduction type and at least a transistor of a second conduction type, and
wherein, in the case in which the sub-threshold current with said transistor of a second conduction type in an off state is larger than the sub-threshold current with said transistor of a first conduction type in an off state, the source potential of said transistor of a second conduction type adapted to turn off during the standby period of said circuit unit is changed at a timing based on said standby period.

31. A semiconductor integrated circuit comprising a level shifter circuit in which the gates and the drains of a first P-ch transistor and a second P-ch transistor for converting the potential of an input signal from the potential of a first power supply to the potential of a second power supply are interconnected by cross coupling, and the gate of at least selected one of said first and second P-ch transistors is connected to the drain of a first N-ch transistor,
wherein the source of said first N-ch transistor of said level shifter circuit is connected to said first power supply through the drain of a third P-ch transistor on the one hand and connected to a third power supply lower than the potential of said first and second power supplies through the drain of a second N-ch transistor, said input signal is input to the gate of said first N-ch transistor.

32. The semiconductor integrated circuit according to claim 31, wherein said input signal is input to each gate of said third P-ch transistor and said second N-ch transistor, and
wherein the potential of said input signal assumes the potential of said third power supply thereby to turn off said first N-ch transistor during the standby period of said level shifter circuit while at the same time turning on said third P-ch transistor thereby to turn off said second N-ch transistor, and the source potential of said first N-ch transistor is kept substantially at the potential of said first power supply during the standby period of said level shifter circuit.

33. The semiconductor integrated circuit according to claim 31, wherein the timing of changing the source potential of said first N-ch transistor adapted to turn off during the standby period of said level shifter circuit is set in accordance with the potential change of said input signal of said level shifter circuit or in accordance with a predetermined program instruction.

34. The semiconductor integrated circuit according to claim 31, wherein a switching element including said third P-ch transistor and said second N-ch transistor is assigned to one or a plurality of said first N-ch transistors adapted to turn off during the standby period of said level shifter circuit, and
wherein a signal for turning on said third P-ch transistor during the standby period of said level shifter circuit is supplied to the gate of the third P-ch transistor in said switching element, and the source potential of one or a plurality of said first N-ch transistors is changed in such a manner that a negative bias voltage is applied between the gate and the source of one or a plurality of said first N-ch transistors by holding the source potential of one or a plurality of said first N-ch transistors substantially to the potential of said first power supply during the standby period of said level shifter circuit.

35. The semiconductor integrated circuit according to claim 31, wherein, in the case in which the sub-threshold current with said first N-ch transistor in an off state in said level shifter circuit is larger than the sub-threshold current with said first P-ch transistor and said second P-ch transistor in an off state, a signal for turning on said third P-ch transistor during the standby period of said level shifter circuit is supplied to the gate of said third P-ch transistor, and the source potential of said first N-ch transistor is changed in such a manner that a negative bias voltage is applied between the gate and the source of said first N-ch transistor by keeping the source potential of said first N-ch transistor substantially at the potential of said fist power supply during the standby period of said level shifter circuit.

36. A semiconductor integrated circuit comprising a level shifter circuit in which the gates and the drains of a first N-ch transistor and a second N-ch transistor for converting the potential of an input signal form the potential of a fourth power supply to the potential of a fifth power supply are interconnected by cross coupling, and the gate of at least a selected one of said first and second N-ch transistors is connected to the drain of a first P-ch transistor;

wherein the source of said first P-ch transistor of said level shifter circuit is connected to said fourth power supply through the drain of a third N-ch transistor on the one hand and connected to a sixth power supply higher than the potential of said fourth and fifth power supplies through the drain of a second P-ch transistor on the other hand.

37. The semiconductor integrated circuit according to claim 36, wherein said input signal is input to the gate of said first P-ch transistor and also, input to each gate of said third N-ch transistor and said second P-ch transistor, and wherein the potential of said input signal assumes the potential of a high voltage thereby to turn off said first P-ch transistor during the standby period of said level shifter circuit while at the same time turning on said third N-ch transistor thereby to turn off said second P-ch transistor, and the source potential of said first P-ch transistor is kept substantially at the potential of said fourth power supply during the standby period of said level shifter circuit.

38. The semiconductor integrated circuit according to claim 36, wherein the timing of changing the source potential of said first P-ch transistor adapted to turn off during the standby period of said level shifter circuit is set in accordance with the potential change of said input signal of said level shifter circuit or in accordance with a predetermined program instruction.

39. The semiconductor integrated circuit according to claim 36, wherein a switching element including said third N-ch transistor and said second P-ch transistor is assigned to one or a plurality of said first P-ch transistors adapted to turn off during the standby period of said level shifter circuit, and wherein a signal for turning on said third N-ch transistor during the standby period of said level shifter circuit is supplied to the gate of said third N-ch transistor in said switching element, and the source potential of said first P-ch transistor is changed in such a manner that a positive bias voltage is applied between the gate and the source of one or a plurality of said first P-ch transistors by keeping the source potential of one or a plurality of said first P-ch transistors substantially at the potential of said fourth power supply during the standby period of said level shifter circuit.

40. The semiconductor integrated circuit according to claim 36, wherein, in the case in which the sub-threshold current with said first P-ch transistor in an off state is larger than the sub-threshold current with said first N-ch transistor and said second N-ch transistor in an off state, a signal for turning on said third N-ch transistor during the standby period of said level shifter circuit is supplied to the gate of said third N-ch transistor, and the source potential of said first P-ch transistor is changed in such a manner that a positive bias voltage is applied between the gate and the source of said first P-ch transistor by keeping the source potential of said first P-ch transistor substantially at the potential of said fourth power supply during the standby period of said level shifter.

41. A method of switching the source potential of a transistor in a semiconductor integrated circuit, comprising the steps of:

forming a circuit unit having a predetermined function by combining a plurality of transistors in a semiconductor integrated circuit;

changing the source potential of at least one transistor adapted to turn off during the standby period of said circuit unit in such a manner that a predetermined bias voltage is applied between the gate and the source of said transistor at a timing based on the standby period of said circuit unit; and reducing the sub-threshold current flowing between the source and the drain of said at least one transistor, wherein the source potential of at least one of the plurality of transistors which turns on during the standby period is not changed substantially.

42. A semiconductor integrated circuit comprising a circuit unit having a predetermined function formed of a plurality of transistors, wherein the source potential of at least one of a plurality of transistors which turns off during the standby period of said circuit unit is changed in a manner such that a negative bias voltage is applied between the gate and the source of said transistor; and wherein the source potential of at least one of a plurality of transistors which turns on during the standby period is connected to a power supply.

* * * * *